(12) United States Patent
Kogawa et al.

(10) Patent No.: US 11,310,909 B2
(45) Date of Patent: Apr. 19, 2022

(54) PRINTED WIRING LINE, ELECTRONIC DEVICE, TOUCH PANEL, GRAVURE PLATE, PRINTED WIRING LINE FORMATION METHOD, TOUCH PANEL PRODUCTION METHOD, AND ELECTRONIC DEVICE PRODUCTION METHOD

(71) Applicant: JAPAN AVIATION ELECTRONICS INDUSTRY, LIMITED, Tokyo (JP)

(72) Inventors: Yutaro Kogawa, Tokyo (JP); Mitsunori Sato, Tokyo (JP); Yutaka Takezawa, Tokyo (JP); Akitoshi Sakaue, Tokyo (JP); Mitsutoshi Naito, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/932,025

(22) Filed: Jul. 17, 2020

(65) Prior Publication Data
US 2020/0352027 A1 Nov. 5, 2020

Related U.S. Application Data

(63) Continuation of application No. 15/363,354, filed on Nov. 29, 2016, now Pat. No. 10,834,815.

(30) Foreign Application Priority Data

Dec. 1, 2015 (JP) .................................. 2015-234435
Mar. 7, 2016 (JP) .................................. 2016-043695

(51) Int. Cl.
*H05K 1/02* (2006.01)
*G06F 3/041* (2006.01)
(Continued)

(52) U.S. Cl.
CPC ........... *H05K 1/0296* (2013.01); *G06F 3/041* (2013.01); *G06F 3/0445* (2019.05);
(Continued)

(58) Field of Classification Search
CPC .. H05K 1/0296; H05K 3/1275; G06F 3/0445; G06F 3/0446; G06F 3/04164; G06F 3/041; G06F 2203/04103
See application file for complete search history.

(56) References Cited

U.S. PATENT DOCUMENTS 9,329,419 B2 * 5/2016 Ohtomo ............ G02F 1/133308
9,503,672 B2 * 11/2016 Chuang .................. G06F 1/1637
(Continued)

FOREIGN PATENT DOCUMENTS

JP 2005-353772 12/2005
JP 2008-159798 A 7/2008
(Continued)

OTHER PUBLICATIONS

U.S. Appl. No. 15/246,873 to Akitoshi Sakaue et al., filed Aug. 25, 2016.
(Continued)

*Primary Examiner* — Sejoon Ahn
(74) *Attorney, Agent, or Firm* — Greenblum & Bernstein, P.L.C.

(57) ABSTRACT

A printed wiring line formed on a substrate connects two different points on the substrate which are connectable by another printed wiring line with a shape of a straight-line segment and has a shape corresponding to at least one of: 1) a shape with no linear part parallel to the straight-line segment; 2) a shape with line segments connected in series, each line segment having a shape with no linear part parallel to the straight-line segment; 3) a shape having a part parallel to the straight-line segment and a part not parallel to the
(Continued)

straight-line segment, length of the part parallel to the straight-line segment being not more than length of the straight-line segment; and 4) a shape in which line segments are connected in series, each line segment having a shape having a part parallel to the straight-line segment and a part not parallel to the straight-line segment.

15 Claims, 22 Drawing Sheets

(51) Int. Cl.
    *H05K 3/12*       (2006.01)
    *G06F 3/044*     (2006.01)

(52) U.S. Cl.
    CPC ........ *G06F 3/0446* (2019.05); *G06F 3/04164* (2019.05); *H05K 3/1275* (2013.01); *G06F 2203/04103* (2013.01); *G06F 2203/04112* (2013.01); *H05K 2201/0969* (2013.01); *H05K 2201/09263* (2013.01); *H05K 2201/09272* (2013.01); *H05K 2201/09681* (2013.01); *H05K 2203/0143* (2013.01)

(56) References Cited

U.S. PATENT DOCUMENTS

| | | | | |
|---|---|---|---|---|
| 2005/0181640 | A1* | 8/2005 | Iikura | H04M 1/0274 439/66 |
| 2006/0066689 | A1* | 3/2006 | Hori | B41J 2/1629 347/68 |
| 2006/0102905 | A1* | 5/2006 | Park | G02F 1/133512 257/72 |
| 2009/0211790 | A1* | 8/2009 | Yokouchi | H05K 3/361 174/254 |
| 2011/0146515 | A1* | 6/2011 | Lee | B41N 1/00 101/395 |
| 2015/0130760 | A1* | 5/2015 | Kim | G06F 3/0445 345/174 |
| 2015/0145813 | A1 | 5/2015 | Takiguchi et al. | |
| 2015/0160760 | A1 | 6/2015 | Sato | |
| 2016/0284895 | A1 | 9/2016 | Hashimoto et al. | |
| 2017/0156206 | A1* | 6/2017 | Kogawa | G06F 3/0446 |
| 2018/0074556 | A1* | 3/2018 | Lee | H05K 7/20963 |
| 2018/0074586 | A1* | 3/2018 | Evans, V | G09G 3/3493 |

FOREIGN PATENT DOCUMENTS

| | | | | |
|---|---|---|---|---|
| JP | 2008-283042 | | 11/2008 | |
| JP | 2010-260176 | | 11/2010 | |
| JP | 2011-148190 | A | 8/2011 | |
| JP | 2013-70005 | A | 4/2013 | |
| JP | 2013-197506 | A | 9/2013 | |
| JP | 2014-103301 | A | 6/2014 | |
| JP | 2014-128925 | A | 7/2014 | |
| JP | 2014128925 | * | 7/2014 | ............... B41F 3/20 |
| JP | 2015-41594 | | 3/2015 | |
| JP | 2015-151026 | | 8/2015 | |
| JP | 2015-184966 | A | 10/2015 | |

OTHER PUBLICATIONS

U.S. Appl. No. 15/363,421 to Yutaro Kogawa et al., filed Nov. 29, 2016.

U.S. Appl. No. 15/220,638 to Mitsunori Sato et al., filed Jul. 27, 2016.

Office Action issued in Japan Counterpart Patent Application No. 2015-234435, dated May 28, 2019, along with an English translation thereof.

Office Action issued in Japan Counterpart Patent Appl. No. 2016-043695, dated Oct. 8, 2019, along with an English translation thereof.

Office Action issued in Japan Counterpart Patent Appl. No. 2015-234435, dated Oct. 29, 2019, (with an English translation thereof).

* cited by examiner

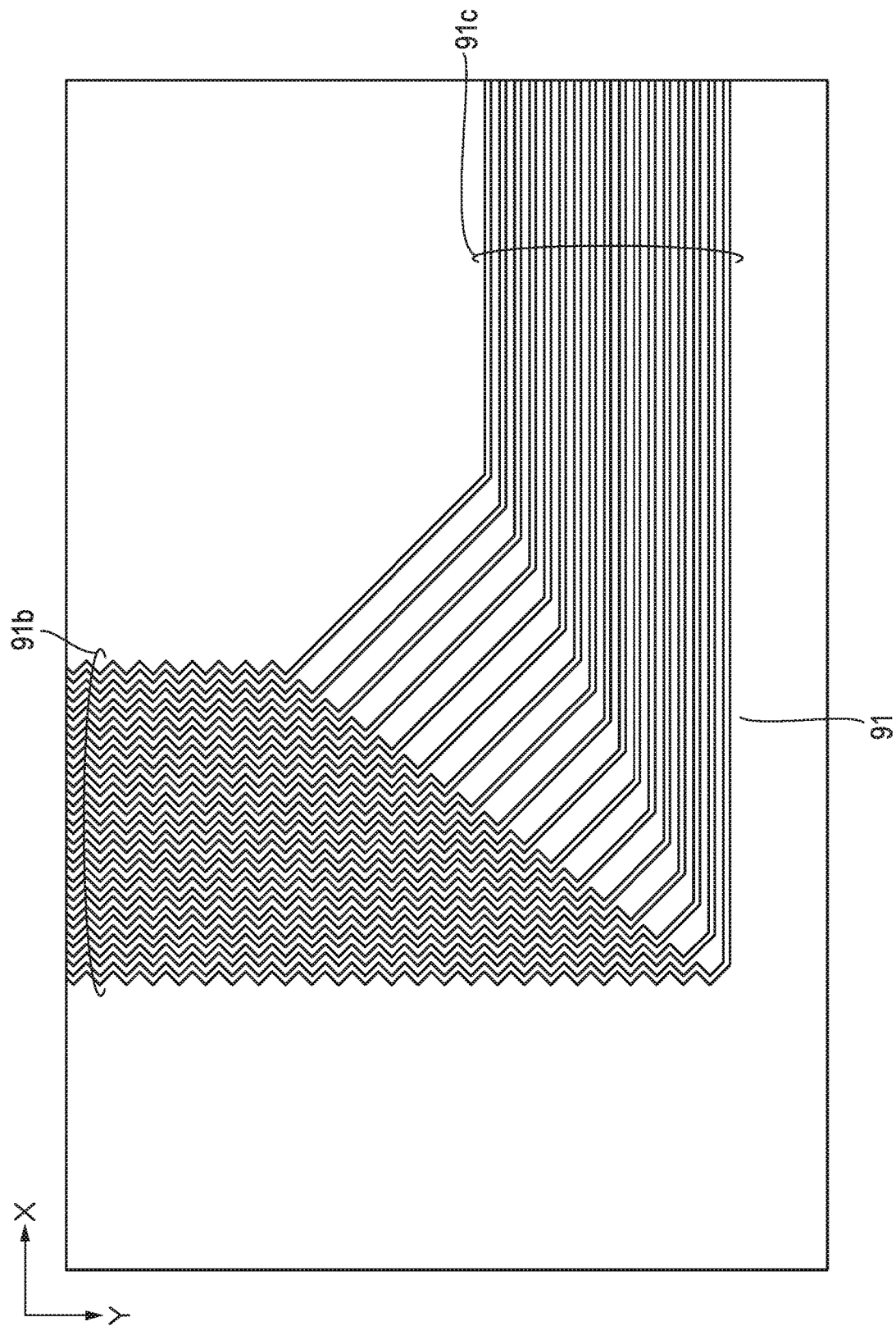

PRINTED WIRING LINE, ELECTRONIC DEVICE, TOUCH PANEL, GRAVURE PLATE, PRINTED WIRING LINE FORMATION METHOD, TOUCH PANEL PRODUCTION METHOD, AND ELECTRONIC DEVICE PRODUCTION METHOD

CROSS-REFERENCE TO RELATED APPLICATIONS

This application is a Continuation of U.S. patent application Ser. No. 15/363,354, filed on Nov. 29, 2016, and which claims priority to Japanese Patent Application No. 2015-234435, filed on Dec. 1, 2015, and to Japanese Patent Application No. 2016-043695, filed on Mar. 7, 2016. The entire disclosures of each of the above-identified applications, including the specification, drawings, and claims of each of these applications, are incorporated by reference herein in their entirety.

TECHNICAL FIELD

A first group of aspects relates to a printed wiring line, an electronic device, a touch panel, a printed wiring line formation method, and a touch panel production method.

A second group of aspects relates to a gravure plate, a printed wiring line, an electronic device, a printed wiring line formation method, and an electronic device production method.

BACKGROUND ART

The background art corresponding to the first group of aspects will be described first.

In recent years, a printing method excellent in productivity and manufacturing cost has been used to form an electrode pattern or a wiring pattern included in various electronic devices, such as a touch panel, a membrane switch, and a liquid crystal display. Gravure offset printing is considered suitable for micropattern formation.

Gravure offset printing uses a gravure plate having recesses corresponding to a predetermined printing pattern, a doctor blade which fills the recesses in the gravure plate with ink, and a blanket which rotates in contact with the gravure plate and receives ink from the doctor blade. The predetermined printing pattern is printed on a printing material by transferring ink shifted on the blanket onto the printing material.

An edge of the doctor blade is pressed against the gravure plate under predetermined pressure. The doctor blade fills the recesses in the gravure plate with ink and squeegees excess ink on the surface of the gravure plate by sliding relatively to the gravure plate.

According to gravure printing, for example, when a longitudinal direction of a recess of a printing pattern formed in a gravure plate coincides with a blade width direction of a doctor blade, a phenomenon may occur in which a tip of the doctor blade sinks in the recess.

The sinking of the doctor blade causes uneven squeegeeing or squeegeeing of part of ink in the recess. This leads to a printing failure, such as non-transfer or an imperfect shape.

Japanese Patent Application Laid Open No. 2011-148190 (hereinafter referred to as "Patent Literature 1") discloses an inking method for avoiding a printing failure due to sinking of a doctor blade. FIGS. 1A, 1B and 2 show a squeegeeing process and a device configuration used for performance of squeegeeing, respectively, disclosed in Patent Literature 1.

In FIG. 2, reference numeral 11 denotes a base; reference numeral 12 denotes a linear guide; and reference numeral 13 denotes a movable table which can travel along the linear guide 12. An alignment mechanism 14 which can change an angle in a horizontal plane is provided on the movable table 13, and a fixed stage 15 is provided on the alignment mechanism 14. The fixed stage 15 holds a planar gravure plate 16. When the gravure plate 16 moves with travel of the movable table 13 along the linear guide 12, a doctor blade 17 which extends in a horizontal direction orthogonal to a longitudinal direction of the linear guide 12 comes into contact with the gravure plate 16 from above the gravure plate 16. Squeegeeing is performed by sliding the doctor blade 17 relatively to a plate surface of the gravure plate 16.

According to Patent Literature 1, a printing pattern 18 in the gravure plate 16 has divided sections delimited along a movement direction (an X direction in FIGS. 1A and 1B) of the movable table 13. In FIGS. 1A and 1B, two divided sections 18a and 18b are set. A main direction 19a or 19b of a groove pattern provided in each of the divided sections 18a and 18b is calculated for the divided section 18a or 18b on the basis of information, such as groove angles (that is, directions in which grooves extend), the number of grooves, and groove widths. In other words, the main direction is a direction with which the most groove angles coincide.

When the doctor blade 17 is to come into contact with the divided section 18a, as shown in FIG. 1A, the gravure plate 16 is rotated by the alignment mechanism 14 before squeegeeing in the divided section 18a such that the main direction 19a of the groove pattern is not parallel with a blade width direction of the doctor blade 17. Since the blade width direction of the doctor blade 17 is not parallel with the main direction 19a of the groove pattern, a tip of the doctor blade 17 is unlikely to sink in a groove.

When the doctor blade 17 is to come into contact with the divided section 18b with travel of the movable table 13, as shown in FIG. 1B, the gravure plate 16 is rotated by the alignment mechanism 14 before squeegeeing in the divided section 18b such that the main direction 19b of the groove pattern is not parallel with the blade width direction of the doctor blade 17. Similarly, the tip of the doctor blade 17 is unlikely to sink in a groove.

The method according to Patent Literature 1 is summarized as follows. Divided sections are predetermined by delimiting a printing pattern in a gravure plate along a movement direction of a movable table, and a main direction of a groove pattern is obtained for each divided section. The gravure plate is rotated relatively to a doctor blade before squeegeeing in each divided section such that a blade width direction of the doctor blade is not parallel with the main direction of the groove pattern in the divided section with which the doctor blade is to come into contact. A tip of the doctor blade is unlikely to sink in a groove, which prevents occurrence of a printing failure.

The method disclosed in Patent Literature 1 requires the tiresome task of delimiting a printing pattern in a gravure plate in advance and obtaining a main direction of a groove pattern in advance in each divided section. Additionally, a conventional printing apparatus cannot be used without change, and a new printing apparatus having an alignment mechanism is needed. In addition, the method disclosed in Patent Literature 1 is not applicable to roll-type gravure offset printing.

Since control is just performed such that a blade width direction of a doctor blade is not parallel with a main direction of a groove pattern, the possibility of establishment of a parallel relationship between the doctor blade and the groove pattern cannot be completely eliminated. It is thus impossible to completely avoid sinking of a doctor blade.

The background art corresponding to the second group of aspects will now be described.

In recent years, a printing method has been used to form an electrode pattern or a wiring pattern of various electronic devices, such as a touch panel, a membrane switch, and an organic EL display. Printing methods are excellent in productivity and advantageous in terms of manufacturing cost. Gravure offset printing, in particular, is drawing attention as a method suitable for formation of a high-precision pattern.

Japanese Patent Application Laid Open No. 2013-70005 (hereinafter referred to as "Patent Literature 2") discloses forming a wiring pattern by gravure offset printing. FIG. 11 shows a gravure offset printing machine described in Patent Literature 2. Patent Literature 2 discloses printing by the following processes (1) to (3) using a gravure offset printing machine 10.

(1) After alignment of a substrate 12 with use of an alignment camera 11, a first intaglio plate 13 as a cylinder is filled with conductive ink by a doctor blade 14. The first intaglio plate 13 has a thin-line pattern engraved therein, and the thin-line pattern is filled with the conductive ink.

(2) The conductive ink is transferred from the first intaglio plate 13 onto a blanket 16 which is attached to a blanket cylinder 15 to perform printing on the substrate 12.

(3) A second intaglio plate 17 as a cylinder is then filled with conductive ink by a doctor blade 18. The conductive ink is transferred from the second intaglio plate 17 onto the blanket 16 to perform printing on the substrate 12. The second intaglio plate 17 has a thick-line pattern engraved therein, which is larger in line thickness than the thin-line pattern of the first intaglio plate 13. The thick-line pattern is filled with the conductive ink. A thin-line pattern from the first intaglio plate 13 and a thick-line pattern from the second intaglio plate 17 are combined on the substrate 12 to form a printing pattern. The printing pattern is then hardened by baking to complete printed matter.

When conductive ink is left on a blanket in the course of formation of a wiring pattern by gravure offset printing using conductive ink, the following printing failures may occur:
 a) predetermined conductive ink is not transferred onto a substrate, and a transferred pattern is chipped; and
 b) the conductive ink left on the blanket is added to conductive ink to be transferred from a gravure plate to cause a printing failure, such as bleeding or an imperfect shape, in a printing pattern on the substrate.

The amount of conductive ink charged into a recess in a gravure plate increases with an increase in the width of a printed wiring line, and a printing failure as described above is more likely to occur.

As a way to avoid such a printing failure, it is conceivable to control printing conditions in accordance with wiring widths. In the case of a configuration using gravure plates (that is, intaglio plates), like the gravure offset printing machine 10 shown in FIG. 11, printing conditions can be controlled by using different gravure plates depending on wiring widths.

A configuration including gravure cylinders to use gravure plates, however, induces an increase in complexity and size of a printing apparatus. Control of printing conditions in such a printing apparatus is tiresome.

SUMMARY

A first group of aspects includes a printed wiring line, an electronic device, a touch panel, a printed wiring line formation method, and a touch panel production method. Aspects included in the first group of aspects will be enumerated.

<Aspect 1>

A printed wiring line formed on a substrate. The printed wiring line connects two different points on the substrate which are connectable by another printed wiring line with a shape of a straight-line segment and has a shape corresponding to at least one of:
 1) a shape with no linear part parallel to the straight-line segment;
 2) a shape in which line segments are connected in series, each line segment having a shape with no linear part parallel to the straight-line segment;
 3) a shape having a part parallel to the straight-line segment and a part not parallel to the straight-line segment, length of the part parallel to the straight-line segment being not more than half of length of the straight-line segment; and
 4) a shape in which line segments are connected in series, each line segment having a shape having a part parallel to the straight-line segment and a part not parallel to the straight-line segment.

<Aspect 2>

Printed wiring lines including at least two printed wiring lines formed parallel to each other on a substrate. The at least two printed wiring lines each have a same shape,
 one of the at least two printed wiring lines connects two different points on the substrate which are connectable by another printed wiring line with a shape of a straight-line segment and has a shape corresponding to at least one of:
  1) a shape with no linear part parallel to the straight-line segment;
  2) a shape in which line segments are connected in series, each line segment having a shape with no linear part parallel to the straight-line segment;
  3) a shape having a part parallel to the straight-line segment and a part not parallel to the straight-line segment, length of the part parallel to the straight-line segment being less than length of the part not parallel to the straight-line segment; and
  4) a shape in which line segments are connected in series, each line segment having a shape having a part parallel to the straight-line segment and a part not parallel to the straight-line segment, and
 the at least two printed wiring lines are arranged so as to coincide with each other when the at least two printed wiring lines are shifted in a direction orthogonal to the straight-line segment.

<Aspect 3>

The printed wiring line according to aspect 1, in which
 the printed wiring line includes at least a group of corner parts which protrude toward one side of the straight-line segment, and
 each corner part included in the group of corner parts has features:
 a) an area of intersection of an imaginary straight extension of one edge part of the corner part and an imaginary straight extension of the other edge part thereof, exclusive of sides of the area of intersection, includes at least a part of an outer printing border which is a printing border defining the corner part and is located on a side where the corner part protrudes; and
 b) the at least part of the outer printing border includes a line segment parallel to the straight-line segment or a line segment forming a convex shape toward a side opposite to the side where the corner part protrudes.

<Aspect 4>

The printed wiring lines according to aspect 2, in which
the one of the at least two printed wiring lines includes at least a group of corner parts which protrude toward one side of the straight-line segment, and
each corner part included in the group of corner parts has features:
a) an area of intersection of an imaginary straight extension of one edge part of the corner part and an imaginary straight extension of the other edge part thereof, exclusive of sides of the area of intersection, includes at least a part of an outer printing border which is a printing border defining the corner part and is located on a side where the corner part protrudes; and
b) the at least part of the outer printing border includes a line segment parallel to the straight-line segment or a line segment forming a convex shape toward a side opposite to the side where the corner part protrudes.

<Aspect 5>

A printed wiring line formed on a substrate, in which
the printed wiring line connects two different points on the substrate which are connectable by another printed wiring line with a shape of a straight-line segment, and further the printed wiring line has a shape in which first linear parts and second linear parts are alternately series-connected, the first linear parts being not parallel to the straight-line segment and the second linear parts being not parallel to the straight-line segment and different from the first linear parts,
the printed wiring line includes at least a group of corner parts which protrude toward one side of the straight-line segment, and
each corner part included in the group of corner parts has the feature that an outer printing border which is a printing border defining the corner part and is located on a side where the corner part protrudes has a shape forming a chevron toward the side where the corner part protrudes.

<Aspect 6>

Printed wiring lines including at least two printed wiring lines formed parallel to each other on a substrate, in which
the at least two printed wiring lines each have a same shape,
one of the at least two printed wiring lines
a) connects two different points on the substrate which are connectable by another printed wiring line with a shape of a straight-line segment,
b) has a shape in which first linear parts and second linear parts are alternately series-connected, the first linear parts being not parallel to the straight-line segment and the second linear parts being not parallel to the straight-line segment and different from the first linear parts, and
c) includes at least a group of corner parts which protrude toward one side of the straight-line segment,
the at least two printed wiring lines are arranged so as to coincide with each other when the at least two printed wiring lines are shifted in a direction orthogonal to the straight-line segment, and
each corner part included in the group of corner parts has the feature that an outer printing border which is a printing border defining the corner part and is located on a side where the corner part protrudes has a shape forming a chevron toward the side where the corner part protrudes.

<Aspect 7>

An electronic device including a printed wiring line according to aspect 1.

<Aspect 8>

An electronic device including printed wiring lines according to aspect 2.

<Aspect 9>

A touch panel including:
a conductor layer including rows of sensor electrodes and lead wiring lines, the rows of sensor electrodes being formed of hardened conductive ink and arrayed in a rectangular sensor region, and the lead wiring lines being led out from the rows of sensor electrodes, in which
each of the rows of sensor electrodes is formed of a mesh which is composed of line segments not parallel to a short side of the sensor region and not parallel to a long side thereof,
each of the lead wiring lines has a same shape,
at least one of the lead wiring lines connects two different points on a substrate which are connectable by another printed wiring line with a shape of a straight-line segment and has a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being less than length of the part not parallel to the straight-line segment; and
4) a shape in which line segments are connected in series, each line segment having a shape having a part parallel to the straight-line segment and a part not parallel to the straight-line segment, and
the lead wiring lines are arranged so as to coincide with each other when the lead wiring lines are shifted in a direction orthogonal to the straight-line segment.

<Aspect 10>

The touch panel according to aspect 9, in which
the one of the lead wiring lines includes at least a group of corner parts which protrude toward one side of the straight-line segment, and
each corner part included in the group of corner parts has features:
a) an area of intersection of an imaginary straight extension of one edge part of the corner part and an imaginary straight extension of the other edge part thereof, exclusive of sides of the area of intersection, includes at least a part of an outer printing border which is a printing border defining the corner part and is located on a side where the corner part protrudes; and
b) the at least part of the outer printing border includes a line segment parallel to the straight-line segment or a line segment forming a convex shape toward a side opposite to the side where the corner part protrudes.

<Aspect 11>

A method for forming a printed wiring line according to aspect 1, including:
a step of printing the printed wiring line by gravure printing, in which
in the step, a recess which defines the printed wiring line, the recess being formed in a gravure plate, is filled with conductive ink by moving a doctor blade, which is set such that a blade width direction is parallel to the straight-line segment, in a direction orthogonal to the blade width direction.

<Aspect 12>

A method for forming printed wiring lines according to aspect 2, including:
a step of printing the printed wiring lines by gravure printing, in which
in the step, recesses which define the printed wiring lines, the recesses being formed in a gravure plate, are filled with conductive ink by moving a doctor blade, which is set such that a blade width direction is parallel to the straight-line segment, in a direction orthogonal to the blade width direction.

<Aspect 13>

A method for forming a printed wiring line according to aspect 3, including:
a step of printing the printed wiring line by gravure printing, in which
in the step, a recess which defines the printed wiring line, the recess being formed in a gravure plate, is filled with conductive ink by moving a doctor blade, which is set such that a blade width direction is parallel to the straight-line segment, in a direction parallel to a direction orthogonal to the blade width direction and toward the group of corner parts.

<Aspect 14>

A method for forming printed wiring lines according to aspect 4, including:
a step of printing the printed wiring lines by gravure printing, in which
in the step, recesses which define the printed wiring lines, the recesses being formed in a gravure plate, are filled with conductive ink by moving a doctor blade, which is set such that a blade width direction is parallel to the straight-line segment, in a direction parallel to a direction orthogonal to the blade width direction and toward the group of corner parts.

<Aspect 15>

A method for forming a printed wiring line according to aspect 5, including:
a step of printing the printed wiring line by gravure printing, in which
in the step, a recess which defines the printed wiring line, the recess being formed in a gravure plate, is filled with conductive ink by moving a doctor blade, which is set such that a blade width direction is parallel to the straight-line segment, in a direction parallel to a direction orthogonal to the blade width direction and toward the group of corner parts.

<Aspect 16>

A method for forming printed wiring lines according to aspect 6, including:
a step of printing the printed wiring lines by gravure printing, in which
in the step, recesses which define the printed wiring lines, the recesses being formed in a gravure plate, are filled with conductive ink by moving a doctor blade, which is set such that a blade width direction is parallel to the straight-line segment, in a direction parallel to a direction orthogonal to the blade width direction and toward the group of corner parts.

<Aspect 17>

A method for producing a touch panel according to aspect 9, including:
a step of printing the lead wiring lines by gravure printing, in which
in the step, recesses which define the lead wiring lines, the recesses being formed in a gravure plate, are filled with the conductive ink by moving a doctor blade, which is set such that a blade width direction is parallel to the straight-line segment, in a direction orthogonal to the blade width direction.

<Aspect 18>

A method for producing a touch panel according to aspect 10, including:
a step of printing the lead wiring lines by gravure printing, in which
in the step, recesses which define the lead wiring lines, the recesses being formed in a gravure plate, are filled with the conductive ink by moving a doctor blade, which is set such that a blade width direction is parallel to the straight-line segment, in a direction parallel to a direction orthogonal to the blade width direction and toward the group of corner parts.

A second group of aspects includes a gravure plate, a printed wiring line, an electronic device, a printed wiring line formation method, and an electronic device production method. Aspects included in the second group of aspects will be enumerated. The ordinal number for an aspect is reset, and the aspects below are sequentially numbered from one.

<Aspect 1>

A gravure plate which is used for gravure offset printing and in which a recess defining printed wiring line is formed, in which
projections are formed on at least a part of a bottom surface of the recess.

<Aspect 2>

The gravure plate according to aspect 1, in which
a top of each of the projections is located between a surface of the gravure plate which comes into contact with a blanket and the bottom surface of the recess, inclusive of the surface of the gravure plate and exclusive of the bottom surface of the recess.

<Aspect 3>

The gravure plate according to aspect 1, in which
one of the projections is present in a width direction of the recess, and the projections are formed in a row in a longitudinal direction of the recess.

<Aspect 4>

The gravure plate according to aspect 2, in which
one of the projections is present in a width direction of the recess, and the projections are formed in a row in a longitudinal direction of the recess.

<Aspect 5>

The gravure plate according to aspect 1, in which
at least a part of the recess connects two different points on the gravure plate which are connectable by another recess with a shape of a straight-line segment and has a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being not more than half of length of the straight-line segment; and
4) a shape in which line segments are connected in series, each line segment having a shape having a part parallel to the straight-line segment and a part not parallel to the straight-line segment.

<Aspect 6>
The gravure plate according to aspect 2, in which
at least a part of the recess connects two different points on the gravure plate which are connectable by another recess with a shape of a straight-line segment and has a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being not more than half of length of the straight-line segment; and
4) a shape in which line segments are connected in series, each line segment having a shape having a part parallel to the straight-line segment and a part not parallel to the straight-line segment.

<Aspect 7>
The gravure plate according to aspect 3, in which
at least a part of the recess connects two different points on the gravure plate which are connectable by another recess with a shape of a straight-line segment and has a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being not more than half of length of the straight-line segment; and
4) a shape in which line segments are connected in series, each line segment having a shape having a part parallel to the straight-line segment and a part not parallel to the straight-line segment.

<Aspect 8>
The gravure plate according to aspect 4, in which
at least a part of the recess connects two different points on the gravure plate which are connectable by another recess with a shape of a straight-line segment and has a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being not more than half of length of the straight-line segment; and
4) a shape in which line segments are connected in series, each line segment having a shape with a part parallel to the straight-line segment and a part not parallel to the straight-line segment.

<Aspect 9>
The gravure plate according to aspect 5, in which
the at least part of the recess includes at least a group of corner parts which protrude toward one side of the straight-line segment, and
one or more of the projections are formed at each corner part included in the group of corner parts.

<Aspect 10>
The gravure plate according to aspect 6, in which
the at least part of the recess includes at least a group of corner parts which protrude toward one side of the straight-line segment, and
one or more of the projections are formed at each corner part included in the group of corner parts.

<Aspect 11>
The gravure plate according to aspect 7, in which
the at least part of the recess includes at least a group of corner parts which protrude toward one side of the straight-line segment, and
one or more of the projections are formed at each corner part included in the group of corner parts.

<Aspect 12>
The gravure plate according to aspect 8, in which
the at least part of the recess includes at least a group of corner parts which protrude toward one side of the straight-line segment, and
one or more of the projections are formed at each corner part included in the group of corner parts.

<Aspect 13>
A printed wiring line formed of conductive ink on a substrate, in which
the printed wiring line includes recesses which are surrounded by the conductive ink, one of the recesses being present in a width direction of the printed wiring line and the recesses forming a row in a longitudinal direction of the printed wiring line, or
the printed wiring line has a contour line asymmetric with respect to the longitudinal direction of the printed wiring line.

<Aspect 14>
The printed wiring line according to aspect 13, in which
at least a part of the printed wiring line connects two different points on the substrate which are connectable by another printed wiring line with a shape of a straight-line segment and has a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being not more than half of length of the straight-line segment; and
4) a shape in which line segments are connected in series, each line segment having a shape having a part parallel to the straight-line segment and a part not parallel to the straight-line segment, and
the at least part of the printed wiring line includes the recesses or the at least part of the printed wiring line has the contour line.

<Aspect 15>
An electronic device including a printed wiring line according to aspect 13.

<Aspect 16>
An electronic device including a printed wiring line according to aspect 14.

<Aspect 17>
A method for forming a printed wiring line by gravure offset printing, including:

a step of transferring conductive ink onto a blanket using a gravure plate having projections formed on at least a part of a bottom surface of a recess defining the printed wiring line.

<Aspect 18>

A method for producing an electronic device using a method according to aspect 17.

Effects

According to the first group of aspects, occurrence of a printing failure due to sinking of a doctor blade in a recess in a gravure plate can be prevented, which allows satisfactory gravure printing of a wiring pattern or a conductor layer.

According to the second group of aspects, occurrence of a printing failure due to conductive ink left on a blanket can be prevented, which allows improvement in printing quality.

BRIEF DESCRIPTION OF THE DRAWINGS

FIG. 19 is a partial enlarged view showing lead wiring lines led out from rows of first sensor electrodes in the touch panel shown in FIG. 16.

DETAILED DESCRIPTION OF THE EMBODIMENTS

An embodiment of a first group of aspects will be described with reference to FIGS. 1 to 10.

The overview of roll-type gravure offset printing will be described first.

Figure 1A:
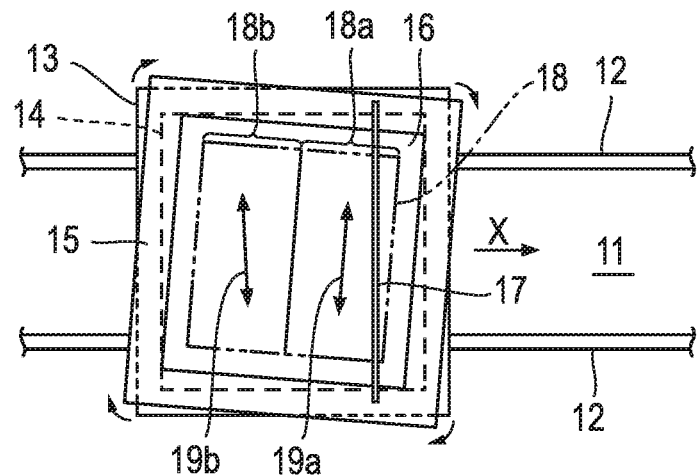
FIG. 1A is a plan view showing a state in which a doctor blade is in contact with a first divided section of a printing pattern, according to a conventional inking method in gravure offset printing.
Figure 1B:
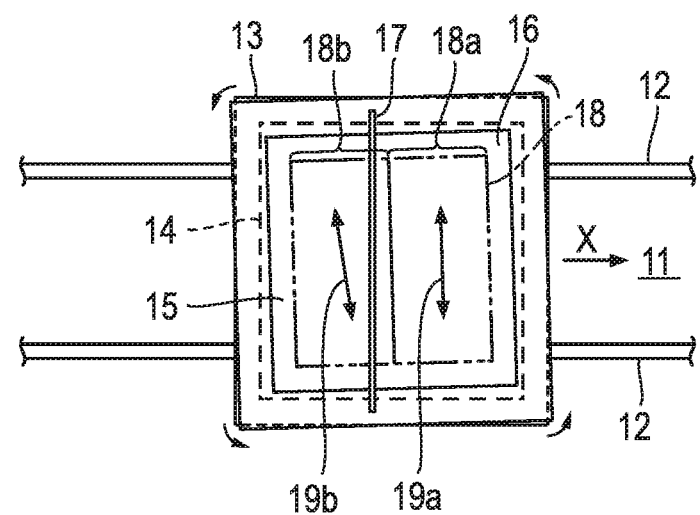
FIG. 1B is a plan view showing a state in which the doctor blade is in contact with a second divided section of the printing pattern after the state in FIG. 1A.
Figure 2:
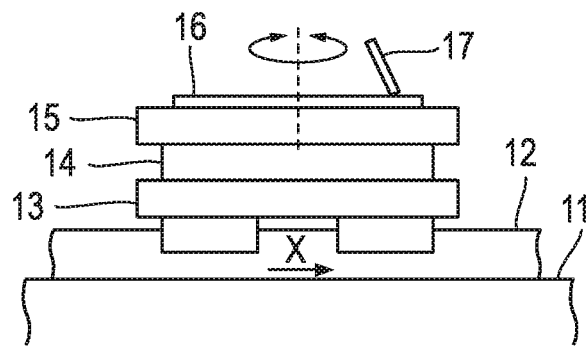
FIG. 2 is a side view showing a device configuration used to perform the conventional inking method in gravure offset printing.
Figure 3:
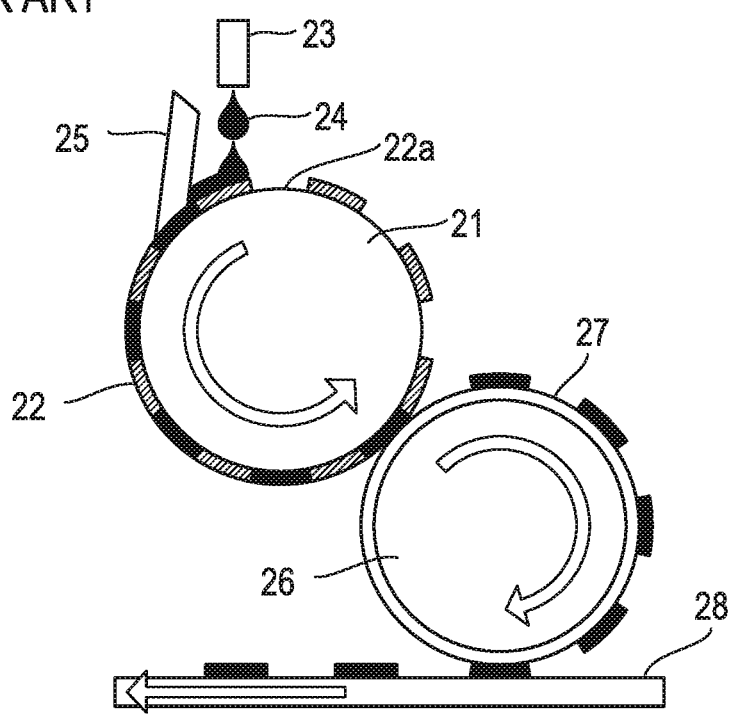
FIG. 3 is a schematic view for explaining the overview of a roll-type gravure offset printing apparatus.

FIG. 3 shows the configuration of a gravure offset printing apparatus. Ink 24 is supplied by a dispenser 23 to a cylindrical gravure plate 22 which is attached to a gravure cylinder 21. A doctor blade 25 levels the ink 24 such that recesses 22a defining a printing pattern formed in the gravure plate 22 are filled with the ink 24. The excess ink 24 is squeegeed by the doctor blade 25. The ink 24 filled in the recesses 22a of the gravure plate 22 is shifted onto a blanket 27 which is attached to a blanket cylinder 26. The blanket 27 rotates while being pressed against the gravure plate 22. The ink 24 shifted on the blanket 27 is shifted again (that is, is transferred) onto a printed board 28. In the above-described manner, a predetermined printing pattern is printed on a printing material.

According to an embodiment of the first group of aspects, a printing failure due to sinking of the doctor blade 25 in the recesses 22a in the gravure plate 22 can be eliminated using a conventional gravure offset printing apparatus without change, in gravure offset printing. An embodiment of the first group of aspects will be instantiated below.

Figure 4:
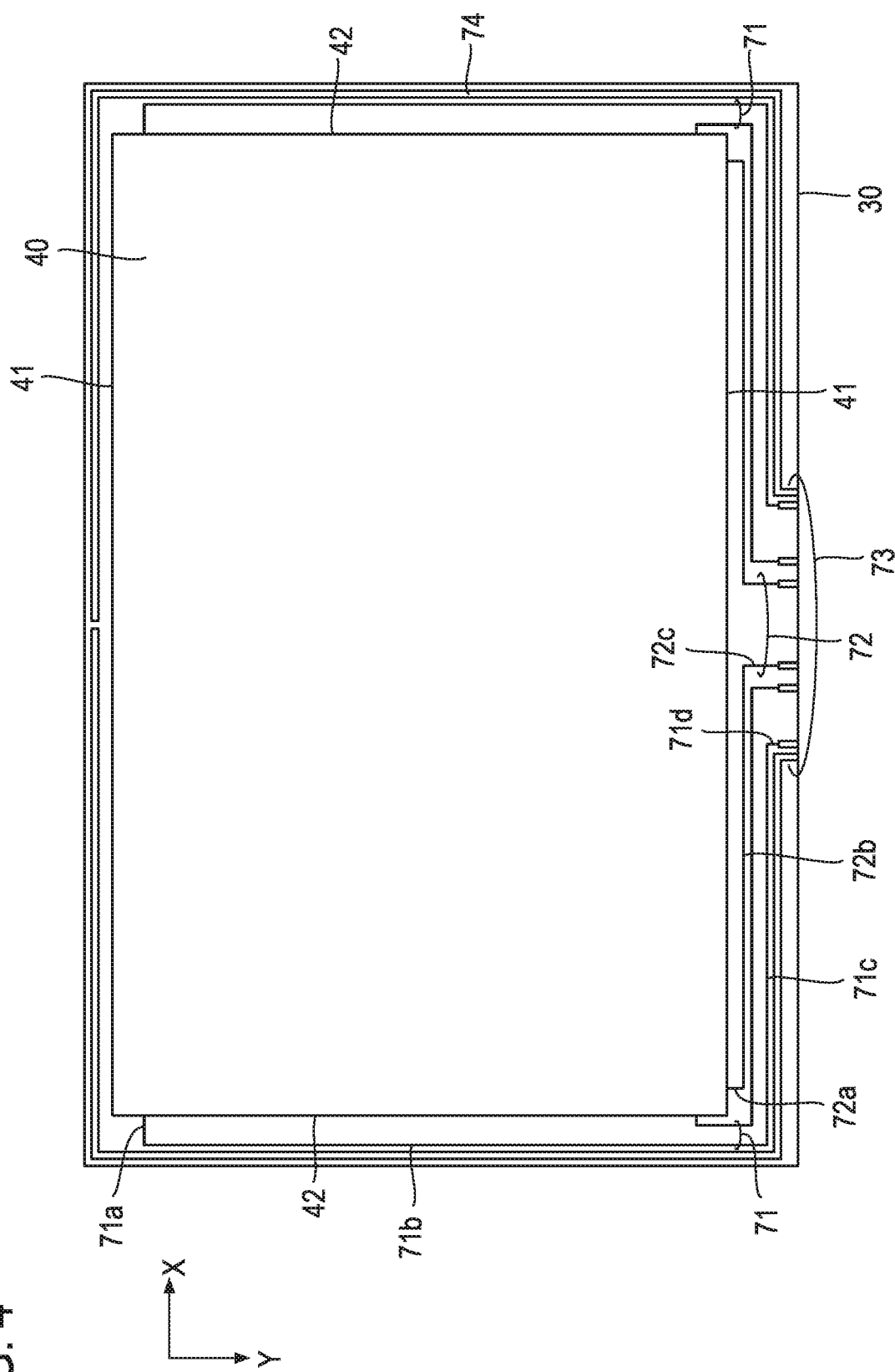
FIG. 4 is a view for explaining the overview of the configuration of a touch panel.

FIG. 4 schematically shows the configuration of a capacitance type touch panel. Reference numeral 30 in FIG. 4 denotes a transparent substrate. The capacitance type touch panel has a configuration in which, for example, a first conductor layer, an insulating layer, a second conductor layer, and a protective layer are stacked in that order on the transparent substrate 30.

Although details are not shown in FIG. 4, a sensor electrode unit include a plurality of rows of first sensor electrodes and a plurality of rows of second sensor electrodes. The rows of first sensor electrodes are formed at the first conductor layer, and the rows of second sensor electrodes are formed at the second conductor layer that is insulated from the first conductor layer by the insulating layer. A rectangular part denoted by reference numeral 40 in FIG. 4 indicates a sensor region where the sensor electrode unit is located.

Figure 5A:
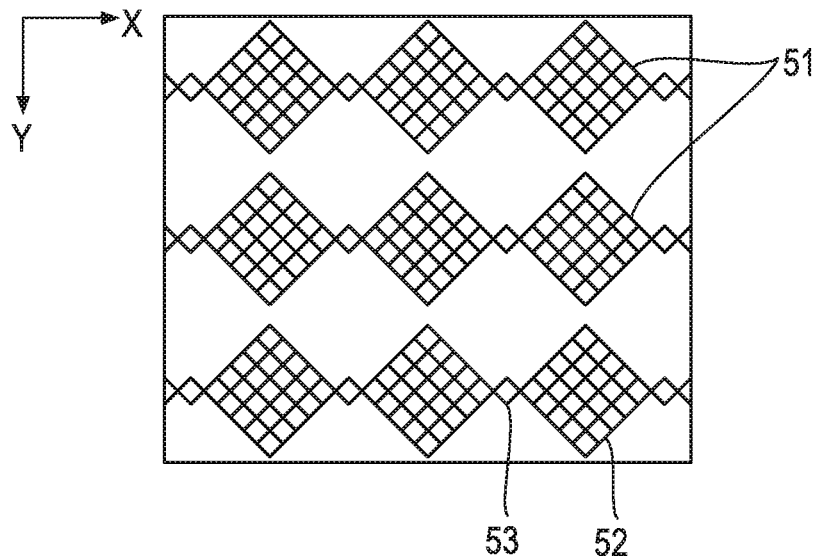
FIG. 5A is a partial enlarged view showing details of a row of first sensor electrodes of the touch panel shown in FIG. 4.
Figure 5B:
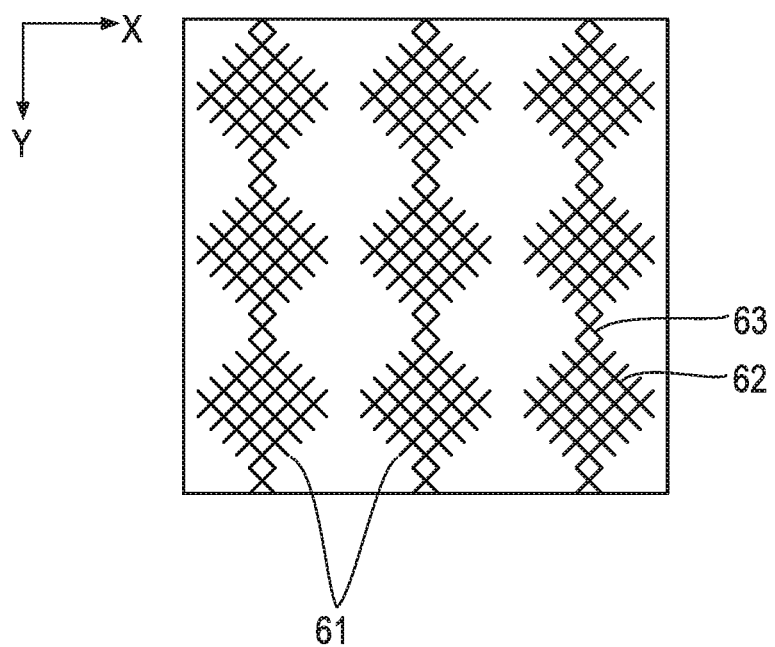
FIG. 5B is a partial enlarged view showing details of a row of second sensor electrodes of the touch panel shown in FIG. 4.

FIG. 5A shows details of each row 51 of first sensor electrodes which is formed at the first conductor layer, and FIG. 5B shows details of each row 61 of second sensor electrodes which is formed at the second conductor layer.

Each row 51 of first sensor electrodes includes island electrodes 52 and joining parts 53, the island electrodes 52 being arrayed in an X direction parallel to a long side 41 of the sensor region 40 and the joining parts 53 joining adjacent ones of the island electrodes 52. The rows 51 of first sensor electrodes are arranged in parallel in a Y direction parallel to a short side 42 of the sensor region 40. Each row 61 of second sensor electrodes includes island electrodes 62 and joining parts 63, the island electrodes 62 being arrayed in the Y direction and the joining parts 63 joining adjacent ones of the island electrodes 62. The rows 61 of second sensor electrodes are arranged in parallel in the X direction. Although not shown in detail, the rows 51 of first sensor electrodes and the rows 61 of second sensor electrodes intersect each other while being insulated from each other, and the joining parts 53 and the joining parts 63 are located so as to overlap with each other. As shown in FIGS. 5A and 5B, the rows 51 of first sensor electrodes and the rows 61 of second sensor electrodes are each formed of a thin-wire mesh which is composed of line segments not parallel to the long sides 41 of the sensor region 40 and not parallel to the short sides 42 thereof (that is, line segments, imaginary straight extensions of which obliquely cross the long sides 41 and obliquely cross the short sides 42) and includes a large number of cellular openings. The outer shapes of the island electrodes 52 and 62 are diamond shapes.

Lead wiring lines 71, lead wiring lines 72, and terminal parts 73 shown in FIG. 4 are each formed at the first conductor layer. Ground wiring lines 74 are formed at each of the first and second conductor layers. Two ends in the X direction of each row 51 of first sensor electrodes are connected to two lead wiring lines 71, and one end in the Y direction of each row 61 of second sensor electrodes is connected to one lead wiring line 72. In FIG. 4, only ones located at two ends of each array of lead wiring lines 71, 72 are shown, and lead wiring lines other than those located at the two ends are not shown.

The terminal parts 73 are formed to be arrayed at a central part of one long side of the transparent substrate 30 having a rectangular shape. Each of lead wiring lines 71, 72 extends toward the corresponding terminal part 73 to connect with the corresponding terminal part 73. The ground wiring lines 74 are formed at a peripheral portion of the transparent substrate 30 so as to surround the sensor region 40 and the lead wiring lines 71, 72. The ground wiring lines 74 are also connected to the terminal parts 73.

Although not shown in detail, the thick terminal parts 73 and the thick ground wiring lines 74 are each formed of a thin-wire mesh which is composed of line segments not parallel to the long sides 41 of the sensor region 40 and not parallel to the short sides 42 thereof (that is, line segments, imaginary straight extensions of which obliquely cross the long sides 41 and obliquely cross the short sides 42) and includes a large number of cellular openings in an extension direction and in a width direction, like the rows 51 of first sensor electrodes and the rows 61 of second sensor electrodes. The thin lead wiring lines 71, 72 are linear wiring lines.

When, by using the gravure offset printing apparatus shown in FIG. 3, the first and second conductor layers with the above-described configurations are formed by printing with conductive ink including conductive particles of silver or the like, a traveling direction (that is, a squeegeeing direction) of the doctor blade with respect to a gravure plate having recesses defining a printing pattern for each conductor layer is typically the X direction that is parallel to the long sides 41 of the sensor region 40, that is, parallel to a long side of the transparent substrate 30 or the Y direction that is parallel to the short sides 42 of the sensor region 40, that is, parallel to a short side of the transparent substrate 30.

Since the rows 51 of first sensor electrodes and the rows 61 of second sensor electrodes, the terminal parts 73, and the ground wiring lines 74 are each formed of a mesh which is composed of line segments not parallel to the X direction and not parallel to the Y direction, the doctor blade does not sink in recesses in the gravure plate defining patterns for the rows 51 of first sensor electrodes, the rows 61 of second sensor electrodes, the terminal parts 73, and the ground wiring lines 74. In contrast, since the lead wiring lines 71, 72 are each composed of a line segment extending straight and parallel to the X direction or the Y direction, the doctor blade may sink in recesses in the gravure plate defining a pattern for the lead wiring lines 71, 72.

To prevent the doctor blade from sinking in recesses in such a gravure plate, in the shown embodiment, at least one of a part extending in the X direction parallel to the long sides 41 of the sensor region 40 and a part extending in the Y direction parallel to the short sides 42 of the sensor region 40 included in each of the lead wiring lines 71, 72 is formed so as to have a shape corresponding to at least one of:
1) a shape with no linear part parallel to a straight-line segment connecting two ends of the part;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being not more than half of length of the straight-line segment; and
4) a shape in which line segments are connected in series, each line segment having a shape having a part parallel to the straight-line segment and a part not parallel to the straight-line segment.

The present embodiment will be described from another perspective. Printed wiring line formed on a substrate connects two different points on the substrate which are connectable by another printed wiring line having a shape of a straight-line segment and has a shape corresponding to at least one of:

1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being not more than half of length of the straight-line segment; and
4) a shape in which line segments are connected in series, each line segment having a shape having a part parallel to the straight-line segment and a part not parallel to the straight-line segment.

Figure 8A:
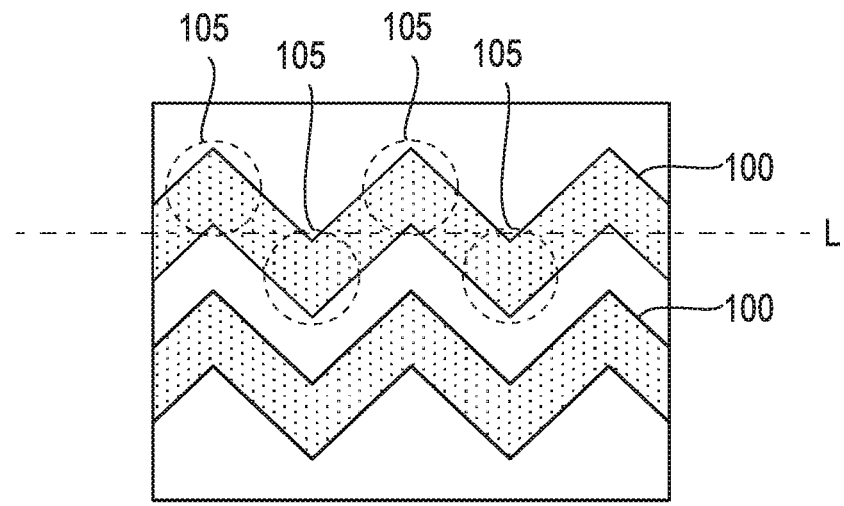
FIG. 8A is a view showing a first example of the shape of printed wiring lines.
Figure 8B:
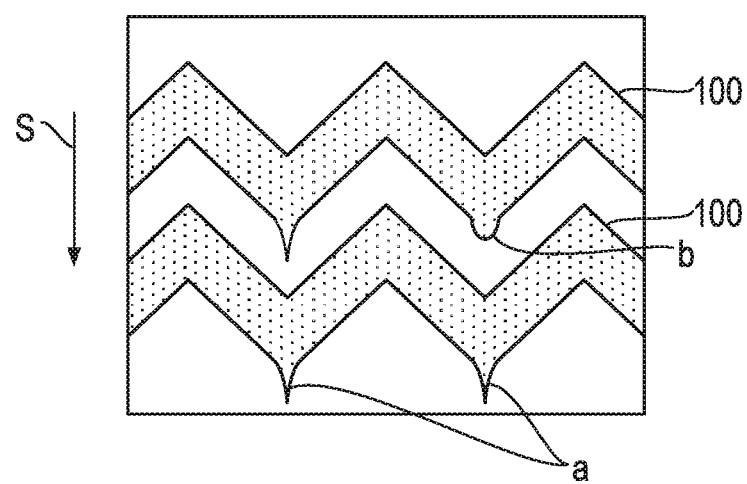
FIG. 8B is a view for explaining ink dragging and bleeding.
Figure 8C:
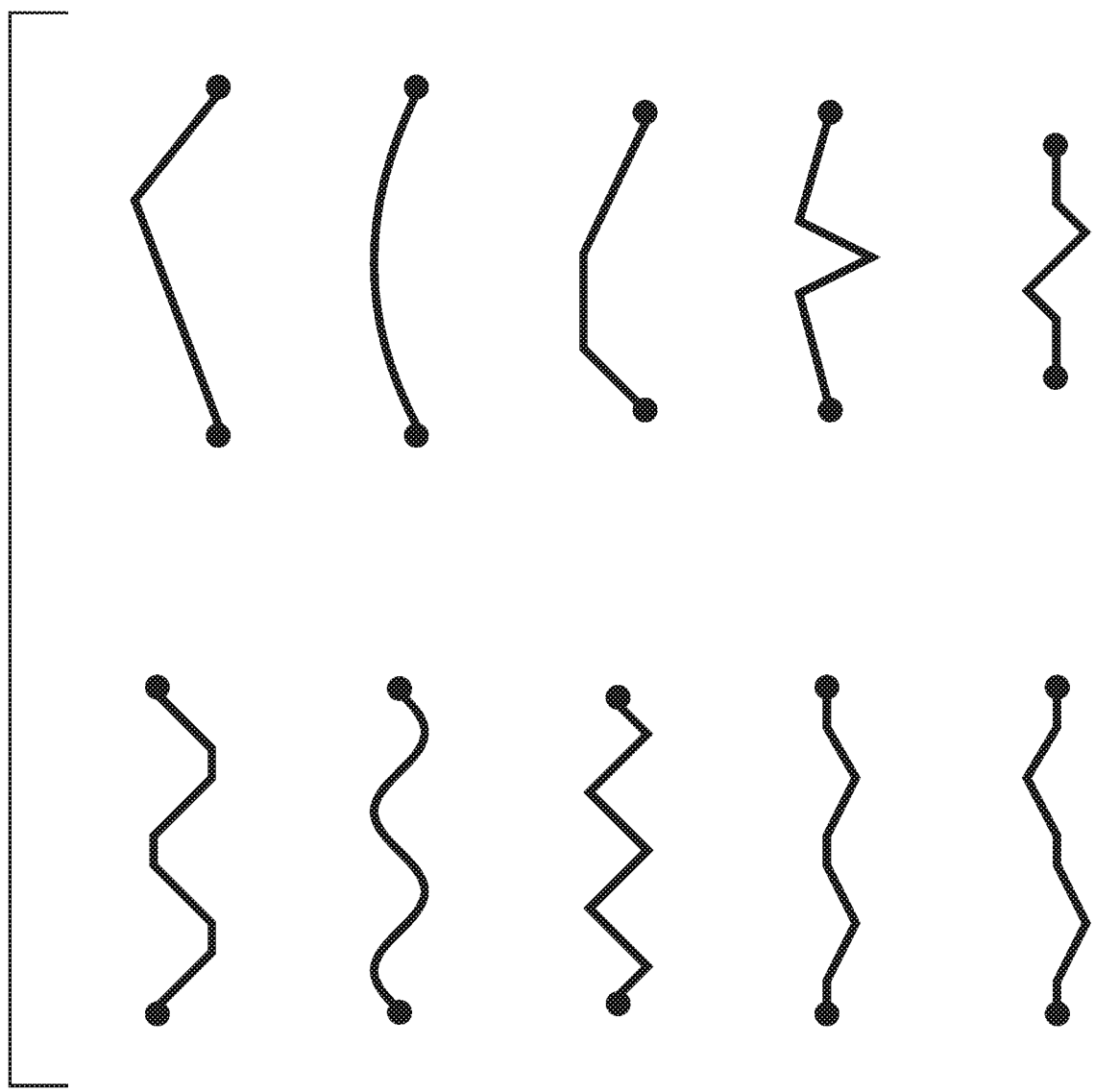
FIG. 8C is a view showing examples of the shape of the printed wiring lines.

Some examples of such a printed wiring line 100 are shown in FIG. 8C. Each of 10 examples shown in FIG. 8C has a shape corresponding to at least one of 1) to 4) described above. The "two different points on the substrate that are connectable by another printed wiring line with the shape of the straight-line segment" are not limited to two ends of a printed wiring line which is recognized to be a single piece by appearance. For example, the two points may be two different bend points of a printed wiring line which is recognized to be a single piece by appearance.

The present embodiment will be described from still another perspective. At least two printed wiring lines formed parallel to each other on a substrate each have a same shape. One of the at least two printed wiring lines connects two different points on the substrate which are connectable by another printed wiring line with a shape of a straight-line segment and has a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being less than length of the part not parallel to the straight-line segment; and
4) a shape in which line segments are connected in series, each line segment having a shape having a part parallel to the straight-line segment and a part not parallel to the straight-line segment.

The at least two printed wiring lines are arranged so as to coincide with each other when the at least two printed wiring lines are shifted in a direction orthogonal to the straight-line segment.

As shown in FIG. 4, each of the lead wiring lines 71 includes a first parallel part 71*a*, a second parallel part 71*b*, a third parallel part 71*c*, and a fourth parallel part 71*d* between a connection to the corresponding row 51 of first sensor electrodes and a connection to the corresponding terminal part 73. Each of the lead wiring lines 72 includes a first parallel part 72*a*, a second parallel part 72*b*, and a third parallel part 72*c* between a connection to the corresponding row 61 of second sensor electrodes and a connection to the corresponding terminal part 73. In this example, the second parallel parts 71*b* of the lead wiring lines 71 are each formed so as to have a shape corresponding to at least one of 1) to 4) above.

Figure 6:
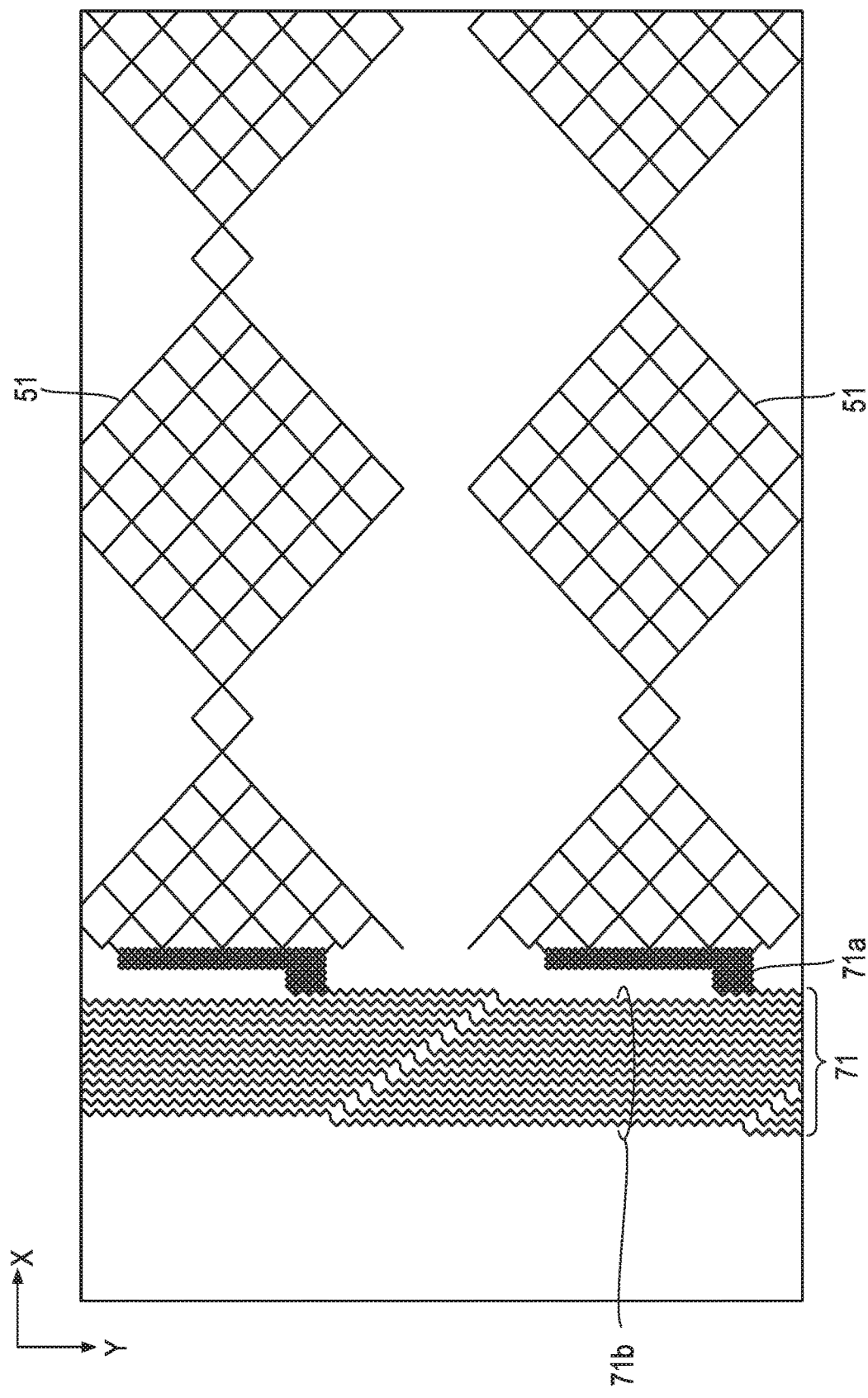
FIG. 6 is a partial enlarged view showing rows of first sensor electrodes in an example of a touch panel according to a first group of aspects and lead wiring lines led out from the rows of first sensor electrodes.
Figure 7:
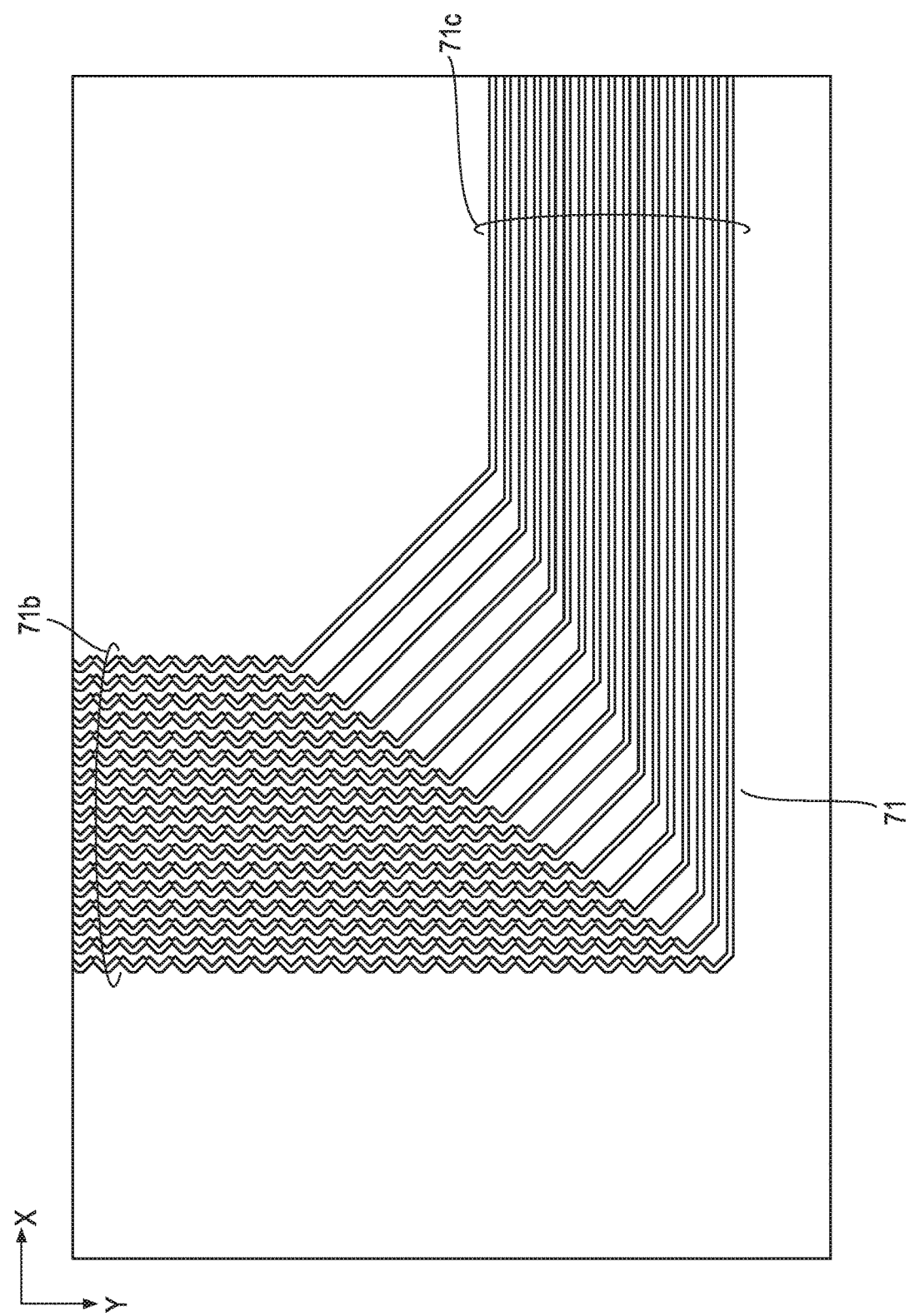
FIG. 7 is a partial enlarged view showing lead wiring lines led out from rows of first sensor electrodes in the example of the touch panel according to the first group of aspects.

FIG. 6 shows, in detail, a state in which the second parallel part 71*b* of each lead wiring line 71 is formed so as to have a shape corresponding to at least one of 1) to 4) above. FIG. 7 shows, in further detail, a connection between the second parallel part 71*b* and the third parallel part 71*c* of each lead wiring line 71. Note that, in this example, each first parallel part 71*a* connecting with the corresponding row 51 of first sensor electrodes is formed of a mesh which is composed of line segments not parallel to the X direction and not parallel to the Y direction, as shown in FIG. 6.

As described above, in the example, the second parallel part 71*b* of each lead wiring line 71 is formed so as to have a shape corresponding to at least one of 1) to 4) above. The second parallel part 72*b* of each lead wiring line 72 is composed of a normal straight line. Note that although not shown in detail, the fourth parallel part 71*d* of each lead wiring line 71 and the first parallel part 72*a* and the third parallel part 72*c* of each lead wiring line 72 are each formed of a mesh in this example, like the first parallel part 71*a* of each lead wiring line 71.

As described above, the second parallel part 71*b* of each lead wiring line 71 is formed so as to have a shape corresponding to at least one of 1) to 4) above. The first conductor layer is formed by gravure offset printing. At the time of the printing, the doctor blade set such that a blade width direction of the doctor blade is parallel to the above-described straight-line segment, that is, the Y direction in this example is moved forward in a direction orthogonal to the above-described straight-line segment (that is, the X direction) on a gravure plate supplied with conductive ink, thereby filling recesses defining a printing pattern for the first conductor layer, the recesses being formed in the gravure plate, with the conductive ink. Thus, sinking of the doctor blade in the recesses of the gravure plate can be avoided, and a printing failure due to sinking of the doctor blade can be prevented from occurring.

FIGS. 8A and 9A to 9C show examples of the shape of printed wiring lines.

The shape of each printed wiring lines 100 shown in FIG. 8A is the shape of a wavy line, notably the shape of a triangular wave (the shape corresponds to at least 2) above). FIG. 8B shows flaws which may appear in the shapes of the printed wiring lines 100 when the printed wiring lines 100 with a triangular wave shape is printed by gravure offset printing. In FIG. 8B, an arrow S indicates a squeegeeing direction. Ink dragging denoted by reference character "a" may occur at corner parts 105 (that is, a corner of a triangular wave) of the printed wiring lines 100 which are located on the front side in the squeegeeing direction. Ink bleeding denoted by reference character "b" may occur at the corner parts 105 in the triangular wave.

The corner part 105 will be described. The corner part 105 is a part of the printed wiring line 100 which protrudes toward one side of the above-described straight-line segment. Especially when the printed wiring line 100 has a triangular wave shape and the shape of the printed wiring line 100 in a direction perpendicular to the above-described straight-line segment and parallel to a surface of a flat printing material is regarded as vibration with amplitude, a reference line L shall mean a straight line obtained by connecting positions of zero amplitude (hereinafter referred to as zero points) on the printed wiring line 100. Each of parts which are parts of the printed wiring line 100 and parts left after zero points and parts in the vicinity of the zero points are removed from the printed wiring line 100 is the corner part 105. Thus, especially when the printed wiring line 100 has a triangular wave shape, the corner parts 105 are arranged on two sides of the reference line L, like walking footprints along the reference line L. Note that the corner parts 105 may be arranged on only one side of the above-described straight-line segment, depending on the shape of the printed wiring line.

Ink dragging or bleeding leads to connection of adjacent printed wiring lines and a circuit defect. For this reason, ink dragging or bleeding constitutes a factor in hindering a decrease in the arrangement pitch of printed wiring lines.

Figure 9A:
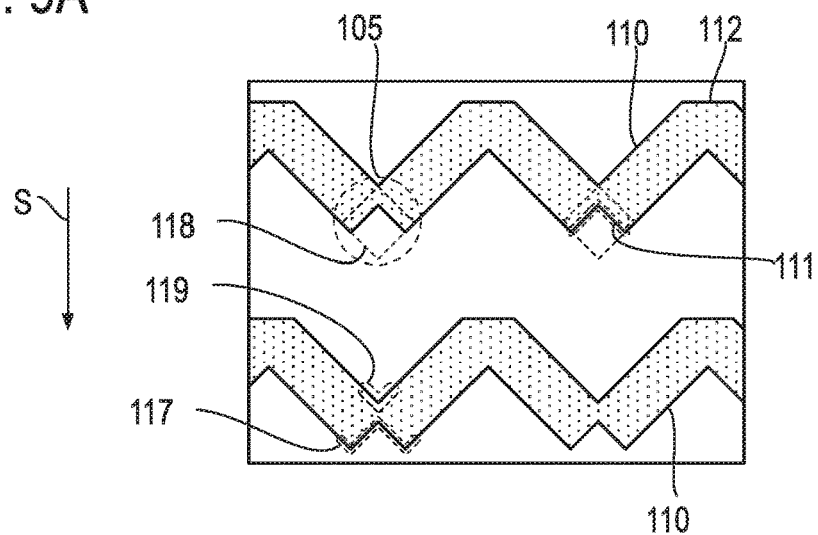
FIG. 9A is a view showing a second example of the shape of the printed wiring lines.
Figure 9B:
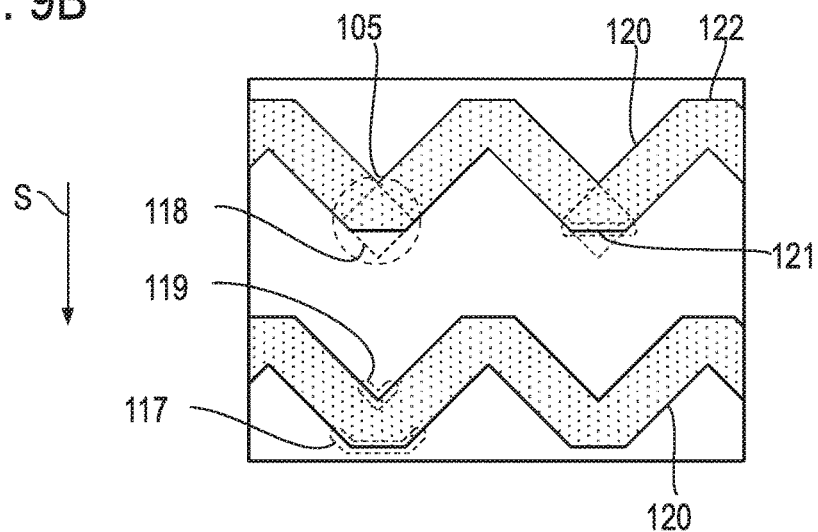
FIG. 9B is a view showing a third example of the shape of the printed wiring lines.
Figure 9C:
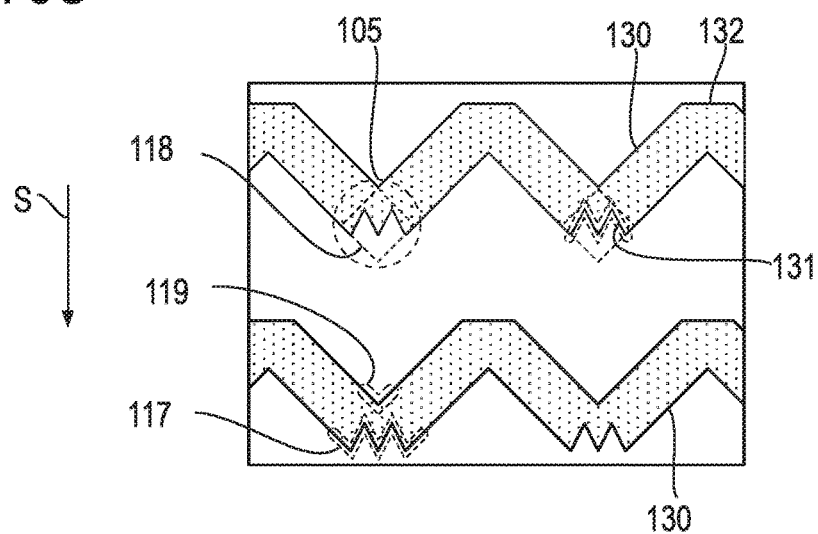
FIG. 9C is a view showing a fourth example of the shape of the printed wiring lines.

Printed wiring lines 110, 120 and 130 shown in FIGS. 9A to 9C each have a shape in which sites like notches are formed at corner parts in a triangular wave which are located on the front side in the squeegeeing direction to reduce the risk of ink dragging or bleeding connecting adjacent printed wiring lines.

A description will be given from another perspective. The printed wiring line 100 includes at least a group of corner parts which protrude toward one side of the above-described straight-line segment (in the case of a triangular wave, a group of corner parts which are located on one side of the reference line L), and each corner part included in the group (in this example, each corner part located on the front side in the squeegeeing direction) has the following features. An area 118 of intersection of an imaginary straight extension of one edge part of the corner part 105 and an imaginary straight extension of the other edge part thereof, exclusive of sides of the area 118 of intersection, includes at least a part of a printing border 117 (hereinafter referred to as an outer printing border 117) which is a printing border defining the corner part 105 and is located on a side where the corner part 105 protrudes. At least a part of the outer printing border 117 includes a line segment (see FIG. 9B) parallel to the above-described straight-line segment or line segments (see FIGS. 9A and 9C, where each line segment is straight but may be curved) which form a convex shape toward a side opposite to the side where the corner part 105 protrudes.

Note that each corner part included in a group of corner parts which protrude toward the other side of the above-described straight-line segment (in the case of a triangular wave, a group of corner parts located on the other side of the reference line L) may be provided with the above-described features.

Note that the outer printing border 117 is a printing border which defines the corner part 105 and does not intersect or contact a printing border 119 which is located on the side opposite to the side where the corner part 105 protrudes.

A description will be given from still another perspective. The printed wiring line 100 includes at least a group of corner parts which protrude toward one side of the above-described straight-line segment (in the case of a triangular wave, a group of corner parts located on one side of the reference line L), and each corner part included in the group (in this example, each corner part located on the front side in the squeegeeing direction) has the following features. See FIGS. 10A and 10B for the following description.

Figure 10A:
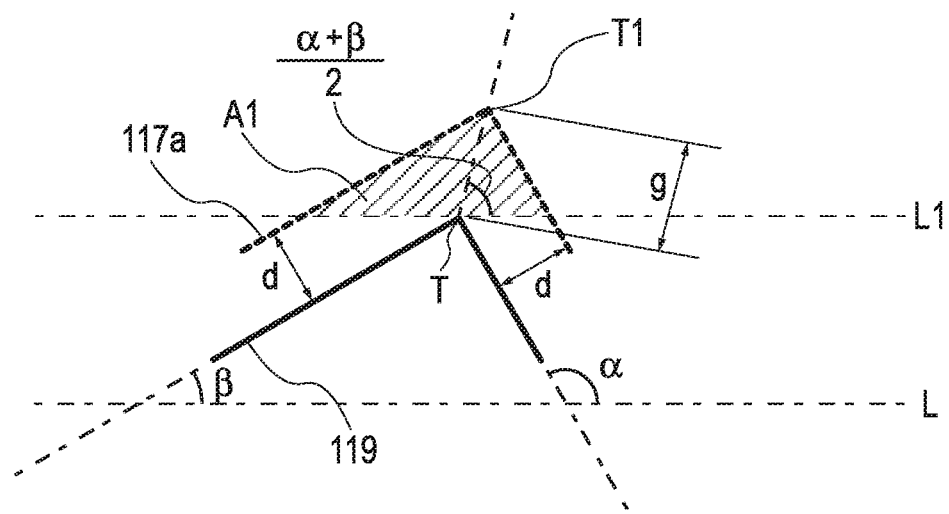
FIG. 10A is a view for explaining features of the shape of the printed wiring line.
Figure 10B:
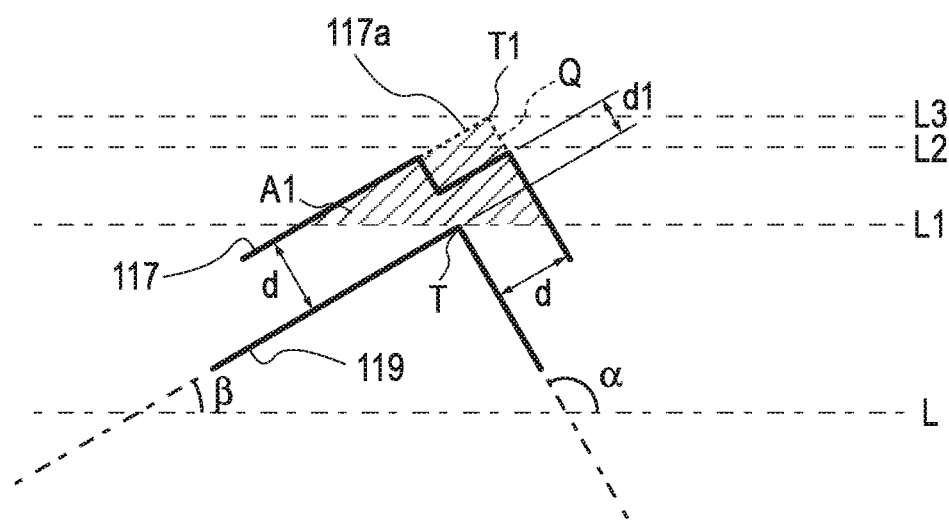
FIG. 10B is a view for explaining features of the shape of the printed wiring line.
Figure 11:
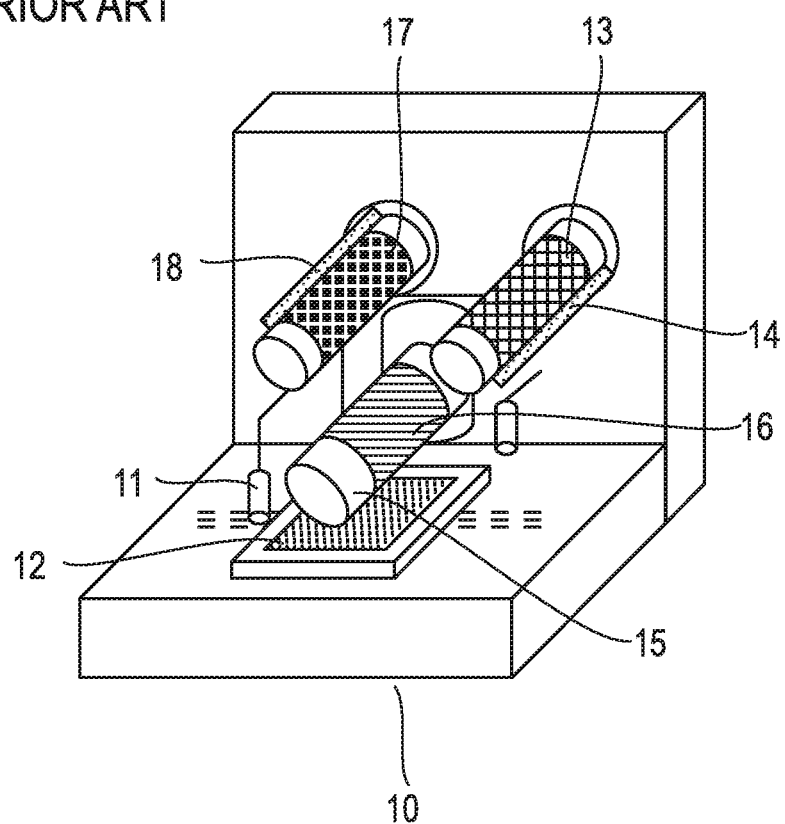
FIG. 11 is a view for explaining a conventional printed wiring formation method by gravure offset printing.

Let $\alpha$ be an angle which an imaginary straight extension of one edge part of a corner part forms with the above-described straight-line segment (the reference line L) and let $\beta$ be an angle which an imaginary straight extension of the other edge part thereof forms with the straight-line segment (the reference line L). Note that the angles with respect to the above-described straight-line segment (the reference line L) are measured in, for example, a counterclockwise direction (the direction is determined to set a standard of measurement, and the angles with respect to the above-described straight-line segment (the reference line L) may be measured in a clockwise direction). For convenience sake, assume that $\alpha \geq \beta$ and $\alpha + \beta \leq \pi$ hold. If $\beta > \alpha$, "one edge part" in the description may be replaced with "the other edge part", and "the other edge part" may be replaced with "one edge part". If $\alpha + \beta > \pi$, the standard of angle measurement may be changed, for example, from counterclockwise measurement to clockwise measurement, and "one edge part" in the description may be replaced with "the other edge part", and "the other edge part" may be replaced with "one edge part". The printing border 119 (hereinafter referred to as an inner printing border 119) that is a printing border which defines the corner part 105 and is located on a side opposite to a side where the corner part 105 protrudes has a single vertex T. Note that the shape of the printing border in the vicinity of the vertex T may be a shape like a shape in the vicinity of a vertex of a polygon or a shape like a shape in the vicinity of an extreme point of a differentiable curve. A line obtained by shifting the inner printing border 119 by a predetermined distance g such that the inner printing border 119 is separate from the above-described straight-line segment (the reference line L) at an angle of $(\alpha+\beta)/2$ [rad] will be referred to as an imaginary outer printing border 117a. A desirable shape of the inner printing border 119 is a shape in which the imaginary outer printing border 117a does not intersect the inner printing border 119 even though the value of the distance g is exceedingly small. The value of the distance g is set such that the shortest distance between the inner printing border 119 and the imaginary outer printing border 117a shifted by the distance g does not fall below a value D defined in advance. The distance g is related to a line width d ($d \geq D$) of a printed wiring line. In the case of a triangular wave, the line width d is given by $d = g \times \sin((\alpha-\beta)/2)$. A straight line which passes through the vertex T of the inner printing border 119 and is parallel to the above-described straight-line segment (the reference line L) will be referred to as a parallel reference line L1. The actual outer printing border 117 (the outer printing border 117 shown in FIG. 10B is an example) has a shape composed only of (a) line segments on the imaginary outer printing border 117a, except for a part Q on the imaginary outer printing border 117a which is included in the vicinity of a position T1 obtained by shifting, by the distance g, the vertex T such that the vertex T is separate from the above-described straight-line segment (the reference line L) at an angle of $(\alpha+\beta)/2$ [rad], and (b) line segments included in a closed region A1 surrounded by the parallel reference line L1 and the imaginary outer printing border 117a (except for sides of the closed region A1). An example of the part Q is a set of line segments on the imaginary outer printing border 117a between a straight line L3, which passes through the position T1 and is parallel to the reference line L, and a straight line L2, which is located between the straight line L3 and the parallel reference line L1 and is parallel to the reference line L. The distance between the parallel reference line L1 and the straight line L2 is given by $\gamma \times g \times \cos((\pi-\alpha-\beta)/2)$. $\gamma$ represents a weighting factor, and $0 < \gamma < 1$ holds. For example, a value of not less than 0.3 and not more than 0.7 can be selected as a value of $\gamma$. The shape of the actual outer printing border 117 is desirably a shape in which the shortest distance d1 between the inner printing border 119 and the actual outer printing border 117 does not fall below the value D defined in advance.

Note that each corner part included in a group of corner parts which protrude toward the other side of the above-described straight-line segment (in the case of a triangular wave, a group of corner parts which are located on the other side of the reference line L) may also be provided with the features.

The printed wiring line 110 shown in FIG. 9A has a shape in which a V-shaped part 111 is formed at each corner part 105. To put it from another perspective, the printed wiring line 110 shown in FIG. 9A has a shape in which the outer printing border 117 located on a side where the corner part 105 protrudes forms chevrons toward the side where the corner part 105 protrudes.

The printed wiring line 120 shown in FIG. 9B has a shape in which a straight part 121 is formed at each corner part 105. The printed wiring line 130 shown in FIG. 9C has a shape in which a W-shaped part 131 is formed at each corner part 105. In a case where such a part is provided at each corner part, even though ink dragging or bleeding occurs, an area of ink dragging or bleeding is small. For this reason, the risk of adjacent printed wiring lines being connected to each other is low, and the arrangement pitch of printed wiring lines can be made small. Note that the printed wiring lines 110, 120 and 130 shown in FIGS. 9A to 9C each have a shape in which a straight part 112, 122, or 132 is formed at each corner part which protrudes in a direction opposite to that for each corner part with the part 111, 121, or 131 (that is, each corner part included in the other group).

The second parallel part 71b of each lead wiring line 71 of the touch panel shown in FIGS. 6 and 7 has the shape shown in FIG. 9A.

Note that, in the touch panel shown in FIG. 4, the second parallel part 71b of each lead wiring line 71 parallel to the short sides 42 of the sensor region 40 is formed so as to have a shape corresponding to at least one of 1) to 4) above. For example, the third parallel part 71c of each lead wiring line 71 and the second parallel part 72b of each lead wiring line 72 that are parallel to the long sides 41 of the sensor region 40 may each be formed so as to have a shape corresponding to at least one of 1) to 4) above. At least one of a part parallel to the short sides of the sensor region and a part parallel to the long sides of the sensor region is formed so as to have a shape corresponding to at least one of 1) to 4) above. At the time of gravure offset printing, the doctor blade set such that the blade width direction is parallel to an extension direction of a wavy line travels in a direction orthogonal to the above-described straight-line segment. Especially when parts as shown in FIGS. 9A to 9C are provided at vertices of corner parts protruding in either one of the squeegeeing direction and a direction opposite thereto parallel to the direction orthogonal to the above-described straight-line segment, the doctor blade squeegees conductive ink in that one direction (that is, parallel to a direction orthogonal to the blade width direction of the doctor blade and from the other group including corner parts without the above-described part 111, 121 or 131 toward one group including corner parts with the above-described part 111, 121 or 131).

In another aspect, the second parallel part 71b of each lead wiring line 71 parallel to the short sides 42 of the sensor region 40 and the third parallel part 71c of each lead wiring line 71 and the second parallel part 72b of each lead wiring line 72 parallel to the long sides 41 may each be formed so as to have a shape corresponding to at least one of 1) to 4) above. Satisfactory squeegeeing can be performed in both of a direction parallel to the short sides 42 of the sensor region 40 and a direction parallel to the long sides 41.

In still another aspect, the parts shown in FIGS. 9A to 9C may be formed at vertices of corner parts located on two sides of the above-described straight-line segment. Satisfactory squeegeeing can be performed both in the squeegeeing direction and a direction opposite thereto. Performing squeegeeing twice in a traveling direction and a direction opposite thereto ensures filling with ink.

The present aspect has been illustrated above in the context of a touch panel. An object to which the present aspect is applied is not limited to a touch panel and may be any electronic device including printed wiring lines.

For example, in a wiring pattern made of a conductive ink film hardened on a base, all of the wiring pattern lines included in the wiring pattern which extend in one or more particular directions parallel to a surface of the base may be composed of wavy lines or all of the wiring pattern lines included in the wiring pattern which extend in the one or more particular directions and not formed of a thin-wire mesh may be composed with wavy lines.

When the printed wiring lines are to be printed by gravure offset printing, conductive ink is squeegeed in a direction orthogonal to the blade width direction by the doctor blade set such that the blade width direction is parallel to one of the one or more particular directions, thereby filling recesses in a gravure plate with the conductive ink. Sinking of the doctor blade in the recesses in the gravure plate can be avoided, and a printing failure due to sinking of the doctor blade can be prevented from occurring.

For example, when the outer shape of a device, on which wiring lines are to be printed, is square, two orthogonal directions parallel to each side of the square are set as particular directions and the above-described parts 111, 121 or 131 are formed at vertices of corner parts on two sides of the above-described straight-line segment, satisfactory squeegeeing can be performed, regardless of the orientation of the device set on a printing apparatus. Alternatively, one of the particular directions may be selected in accordance with a printing execution situation.

Note that printing used in the present aspect is not limited to roll-type gravure offset printing and may be flat-type gravure offset printing or gravure printing.

The foregoing description of the embodiment of the first group of aspects has been presented for the purpose of illustration and description. It is not intended to be exhaustive or to limit the first group of aspects to the precise form disclosed. Modifications or variations are possible in light of the above teachings. The embodiment was chosen and described to provide the illustration of the principles of the first group of aspects and its practical application, and to enable one of ordinary skill in the art to utilize the first group of aspects in various embodiments and with various modifications as are suited to the particular use contemplated. All such modifications and variations are within the scope of the first group of aspects as determined by the appended claims when interpreted in accordance with the breadth to which they are fairly, legally, and equitably entitled.

An embodiment of a second group of aspects will be described with reference to FIGS. 12 to 21. The following description and the drawings to be referred to include a description overlapping with the description of the embodiment of the first group of aspects and a drawing overlapping with the drawings referred to in the description of the embodiment of the first group of aspects.

The overview of roll-type gravure offset printing will be described first.

Figure 12:
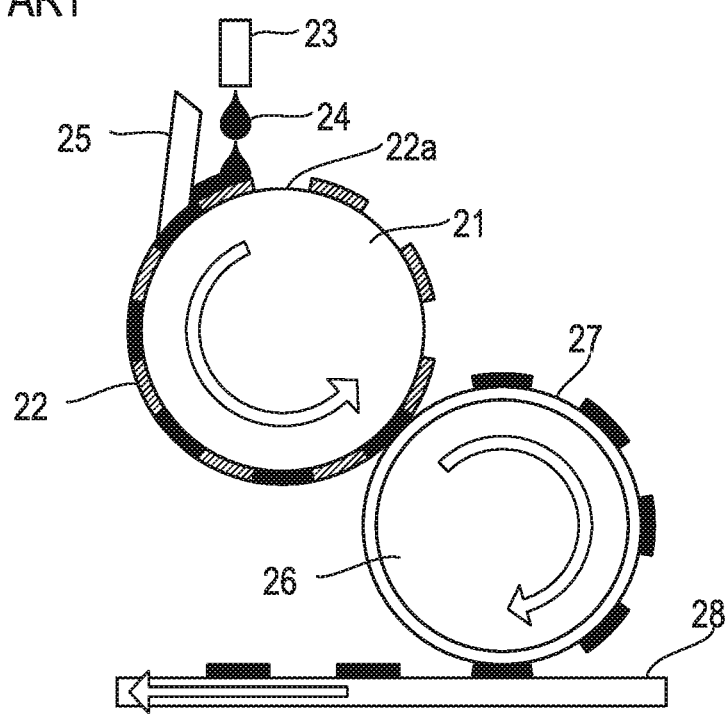
FIG. 12 is a schematic view for explaining the overview of a roll-type gravure offset printing apparatus.

FIG. 12 shows the configuration of a gravure offset printing apparatus. Ink 24 is supplied by a dispenser 23 to a cylindrical gravure plate 22 which is attached to a gravure cylinder 21. A doctor blade 25 levels the ink 24 such that recesses 22a defining a printing pattern formed in the gravure plate 22 are filled with the ink 24. The excess ink 24 is squeegeed by the doctor blade 25. The ink 24 filled in the recesses 22a of the gravure plate 22 is shifted onto a blanket 27 which is attached to a blanket cylinder 26 and rotates while being pressed against the gravure plate 22. The ink 24 shifted on the blanket 27 is shifted (that is, transferred) onto a printed board 28. In the above-described manner, a predetermined printing pattern is printed on a printing material. After that, the ink 24 is hardened, and printing is completed.

According to an embodiment of the second group of aspects, occurrence of a printing failure due to conductive ink left on a blanket without being transferred onto a substrate can be prevented without changing the configuration of a gravure offset printing apparatus, in formation of printed wiring lines by gravure offset printing. An embodiment of the second group of aspects will be instantiated below.

As described earlier, conductive ink left on a blanket is likely to appear when the amount of conductive ink charged into recesses in a gravure plate is large or when wiring lines having a large line width is to be printed. Thus, in the example below, projections are formed on a bottom surface of a recess in a gravure plate which defines a thick wiring line. The formation of the projections reduces the volume of the recess. For this reason, the amount of conductive ink decreases in accordance with the volume of the projections.

Figure 13A:
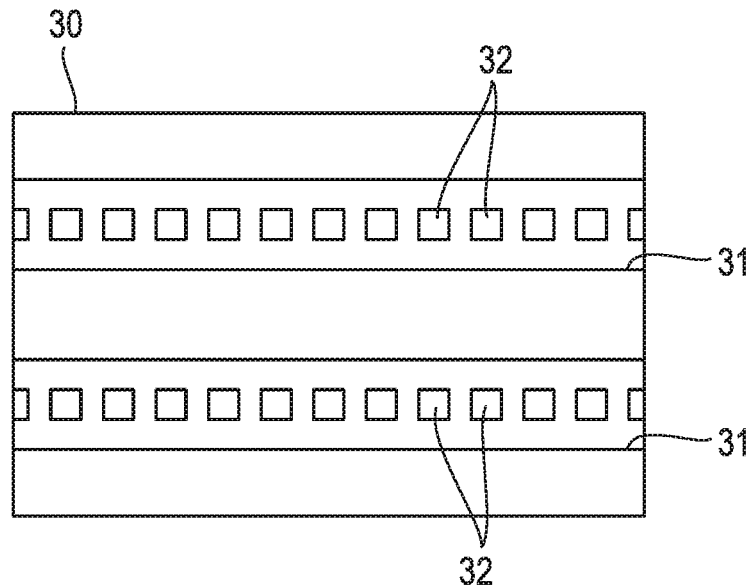
FIG. 13A is a view for explaining a first example of a gravure plate according to a second group of aspects.
Figure 13B:
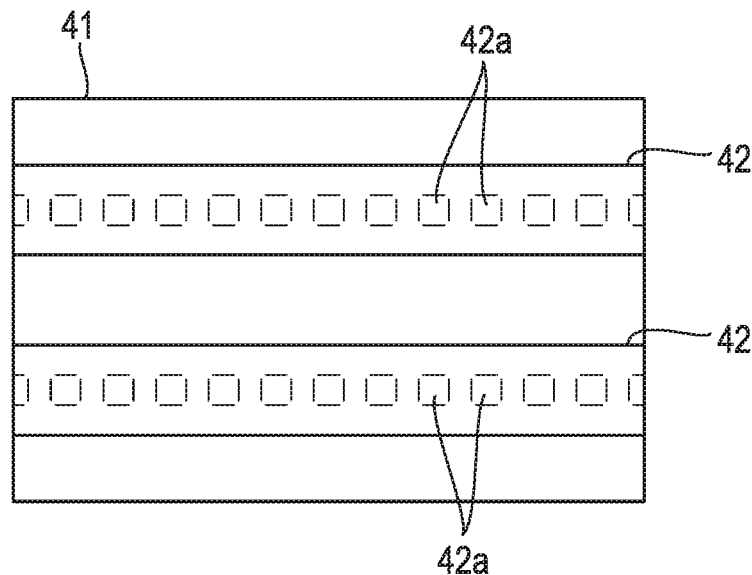
FIG. 13B is a view showing printed wiring lines formed using the gravure plate shown in FIG. 13A.
Figure 14A:
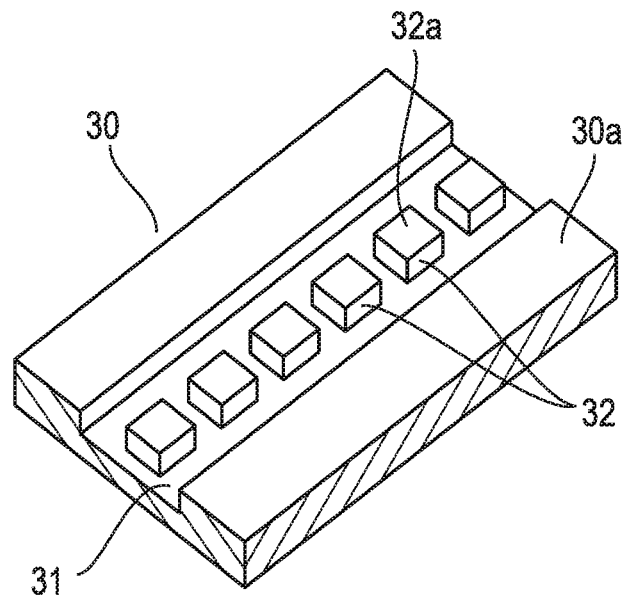
FIG. 14A is a partial enlarged perspective view of the gravure plate shown in FIG. 13A.
Figure 14B:
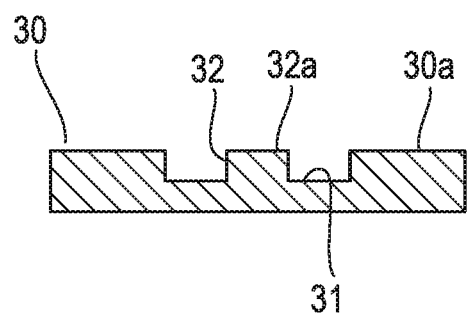
FIG. 14B is a partial enlarged sectional view of FIG. 13A.
Figure 14C:
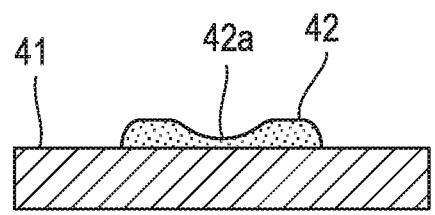
FIG. 14C is a partial enlarged sectional view of FIG. 13B.

FIG. 13A shows a part of a gravure plate having projections formed on a bottom surface of each recess which defines a thick wiring line. FIG. 13B shows a part of each printed wiring line which is formed on a substrate by printing with the gravure plate shown in FIG. 13A, juxtaposed to FIG. 13A. FIG. 14A shows a part of FIG. 13A, and FIGS. 14B and 14C show respective cross-sections of the gravure plate and the printed wiring line shown in FIGS. 13A and 13B.

In this example, on a bottom surface of a recess 31 in a gravure plate 30 which defines a thick wiring line, projections 32 are formed with predetermined spacing in a row in a longitudinal direction of the recess 31, that is, a longitudinal direction of the thick wiring line so as to protrude. In the example, one row of projections 32 is formed along a center line of the recess 31 (that is, a line obtained by connecting midpoints between two side surfaces of the recess 31). That is, only one projection 32 not in contact with two side surfaces of the recess 31 is present in a width direction of the recess 31 (a width direction of the wiring line), and projections 32 are present in the longitudinal direction of the recess 31.

In the example, each projection 32 has a square top surface 32a. Each top surface 32a is located on a plane including an upper surface 30a of the gravure plate 30.

When a wiring line is printed by gravure offset printing using the gravure plate 30 and conductive ink, spaces corresponding to the projections 32, that is, recesses surrounded by the conductive ink, are formed in the printed wiring line. Due to bleeding on a blanket and bleeding on a substrate of the conductive ink, each space is filled with the conductive ink soon. Note that some of the spaces may not be fully filled, and smaller spaces may be left. FIG. 13B shows a state in which printed wiring lines 42 with all spaces filled with the conductive ink are formed on a substrate 41. In a part where a space is filled with the conductive ink, the thickness of a conductive ink film is smaller, and a dimple 42a is formed in an upper surface of the printed wiring line 42, as shown in FIG. 14C. One dimple 42a is present in a width direction of the printed wiring line 42, and dimples 42a are present in a longitudinal direction of the printed wiring line 42.

When all the spaces are not filled with the conductive ink, that is, a space without the conductive ink is formed in the printed wiring line 42, only one space without ink film is present in the width direction of the printed wiring line 42, and one or more spaces without ink film are present in the longitudinal direction of the printed wiring line 42.

The formation of the projections 32 on the bottom surfaces of the recesses 31 defining the thick printed wiring lines 42 in the gravure plate 30 allows the amount of conductive ink charged into the recesses 31 to be reduced in accordance with the volume of the projections 32. The amount of conductive ink transferred onto the blanket is controlled, and the problem of conductive ink being left on the blanket without being transferred onto a substrate is resolved. This prevents occurrence of a printing failure due to conductive ink left on the blanket. A reduction in the amount of conductive ink charged into the recesses 31 brought about by the formation of the projections 32 is also effective as measures against swelling of the blanket.

Figure 15A:
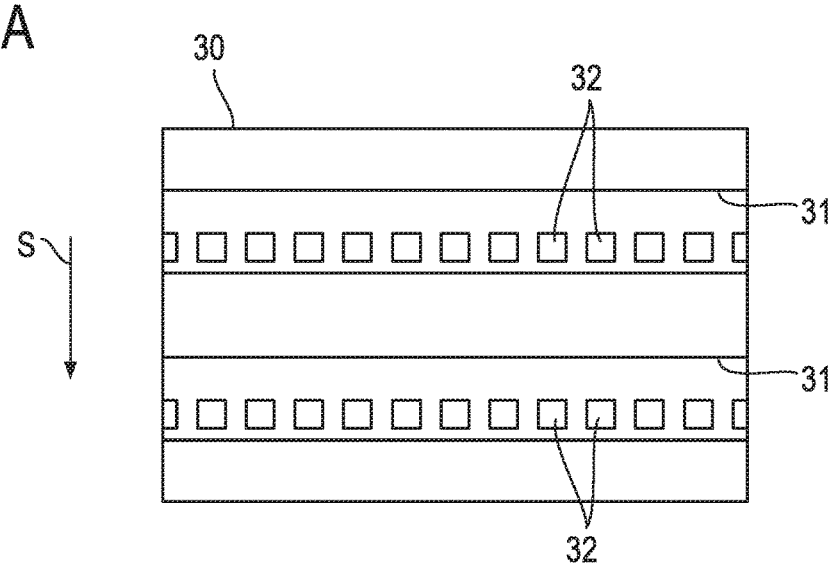
FIG. 15A is a view for explaining a second example of the gravure plate according to the second group of aspects.

Although the projections 32 are formed along the center line extending in the longitudinal direction of the recess 31 in FIG. 13A, the projections 32 may be formed along a line deviated from the center line of the recess 31, as shown in FIG. 15A.

Figure 15B:
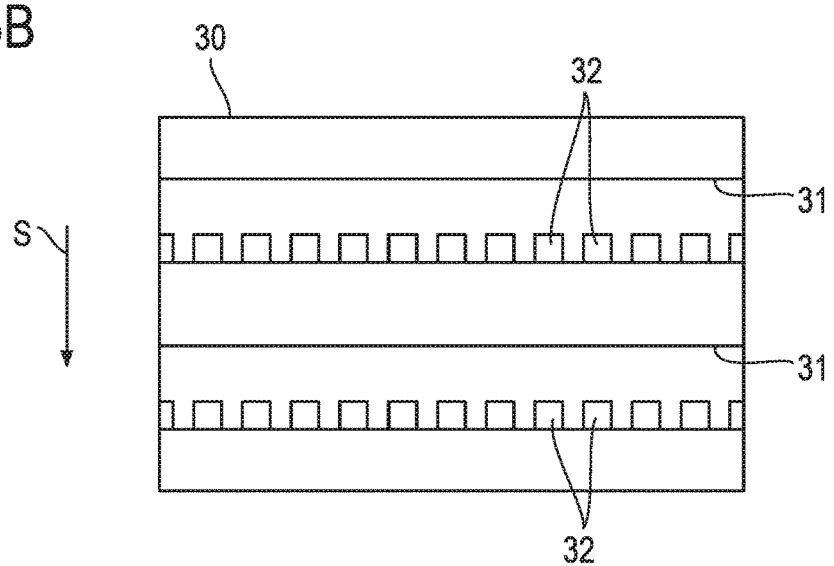
FIG. 15B is a view for explaining a third example of the gravure plate according to the second group of aspects.

As shown in FIG. 15B, the projections 32 may be formed so as to line up in contact with one side surface of the recess 31. In this case, when a wiring line is printed by gravure offset printing using the gravure plate 30 and conductive ink, the printed wiring line has a contour line asymmetric with respect to a longitudinal direction of the printed wiring line.

Figure 15C:
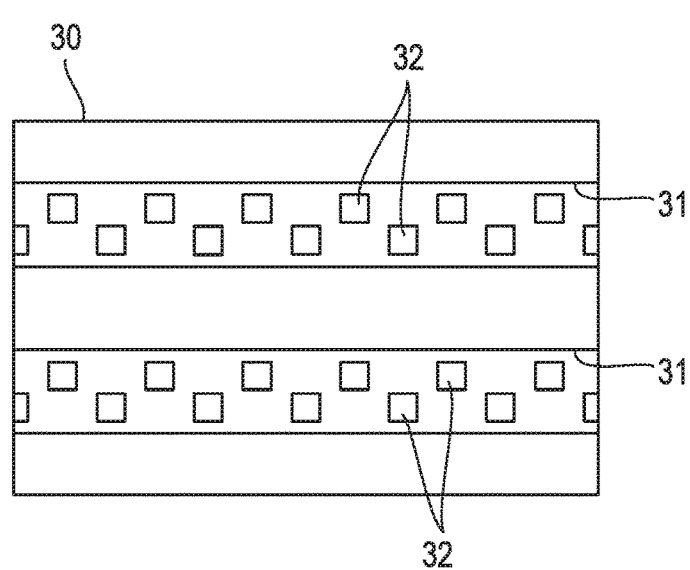
FIG. 15C is a view for explaining a fourth example of the gravure plate according to the second group of aspects.

As shown in FIG. 15C, the projections 32 may be arranged on alternating sides in the width direction of the recess 31 in a so-called staggered arrangement.

A traveling direction (that is, a squeegeeing direction) of a doctor blade in gravure offset printing is reflected in the arrangement of the projections 32 shown in each of FIGS. 15A and 15B. In FIGS. 15A and 15B, an arrow S indicates the squeegeeing direction. As shown in FIGS. 15A and 15B, the projections 32 are arranged shifted toward the front side in the squeegeeing direction in the recess 31. Accordingly, the configuration makes spaces in a wiring line corresponding to the projections 32 easier to fill. Filling the spaces reduces a resistance value of the wiring line.

The configuration of a capacitance-type touch panel as an example of an electronic device according to the second group of aspects will next be described.

Figure 16:
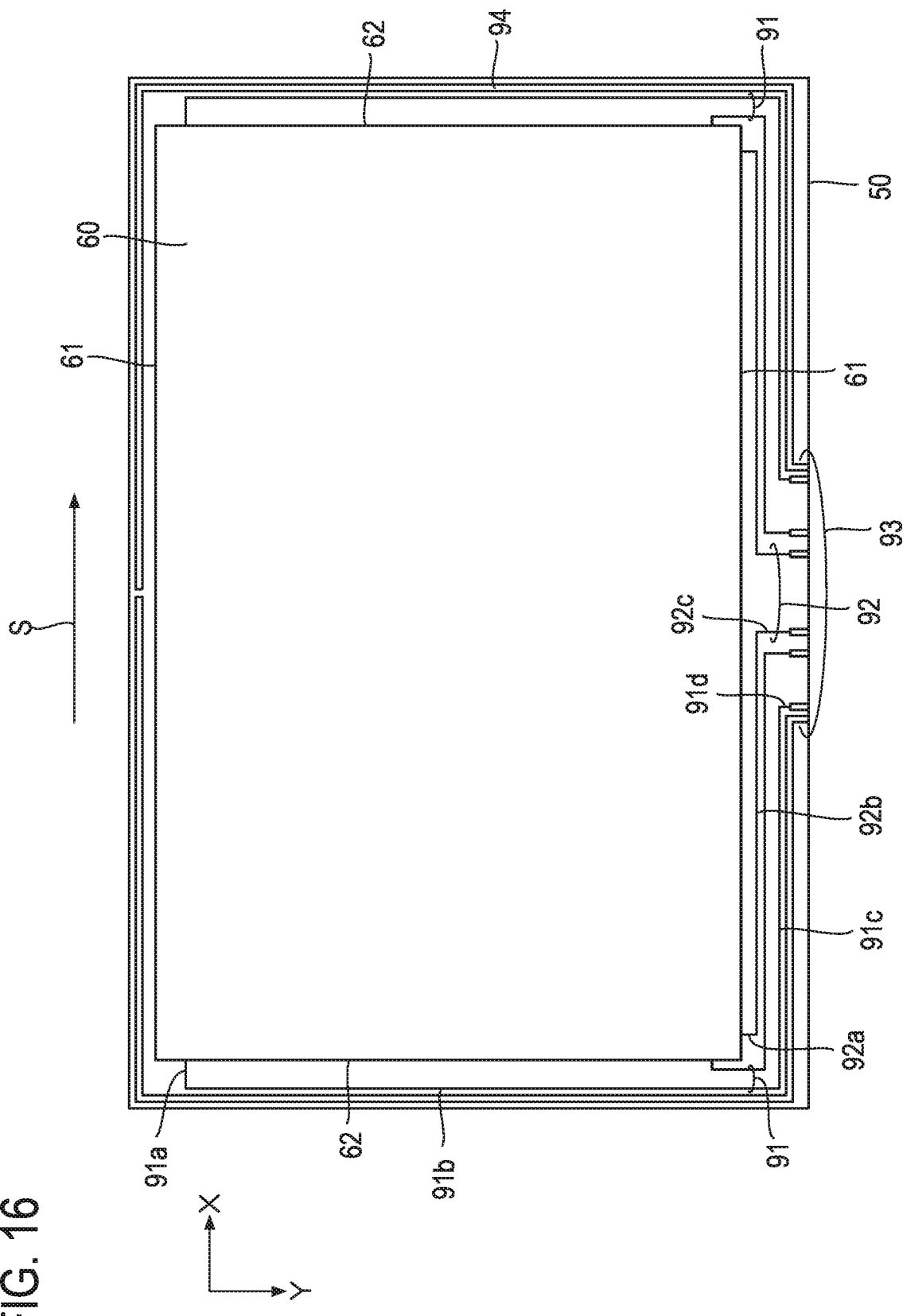
FIG. 16 is a view for explaining the overview of the configuration of a touch panel as an example of an electronic device according to the second group of aspects.

FIG. 16 schematically shows the configuration of the capacitance-type touch panel. In FIG. 16, reference numeral 50 denotes a transparent substrate. The capacitance-type touch panel has a configuration in which, for example, a first conductor layer, an insulating layer, a second conductor layer, and a protective layer are stacked in that order on the transparent substrate 50.

Although details are not shown in FIG. 16, a sensor electrode unit include a plurality of rows of first sensor electrodes and a plurality of rows of second sensor electrodes. The rows of first sensor electrodes are formed at the first conductor layer, and the rows of second sensor electrodes are formed at the second conductor layer that is insulated from the first conductor layer by the insulating layer. A rectangular part denoted by reference numeral 60 in FIG. 16 indicates a sensor region where the sensor electrode unit is located.

Figure 17A:
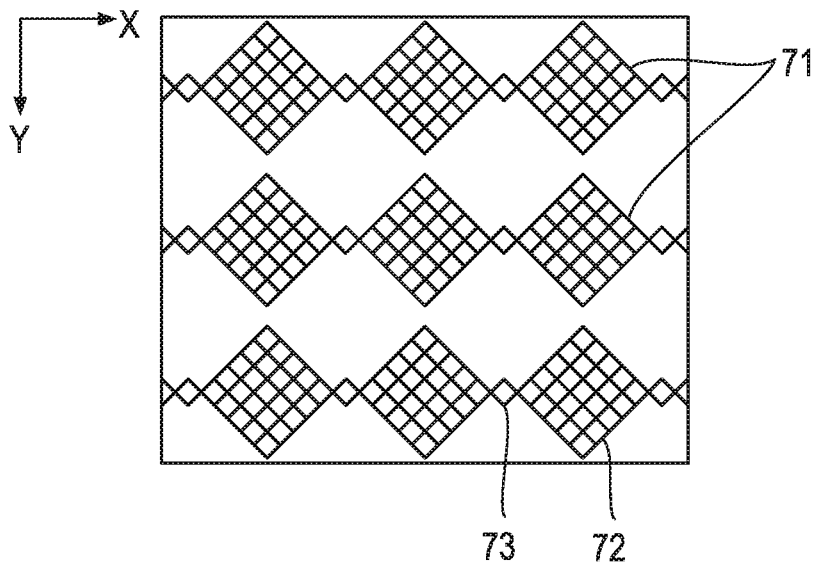
FIG. 17A is a partial enlarged view showing details of rows of first sensor electrodes of the touch panel shown in FIG. 16.
Figure 17B:
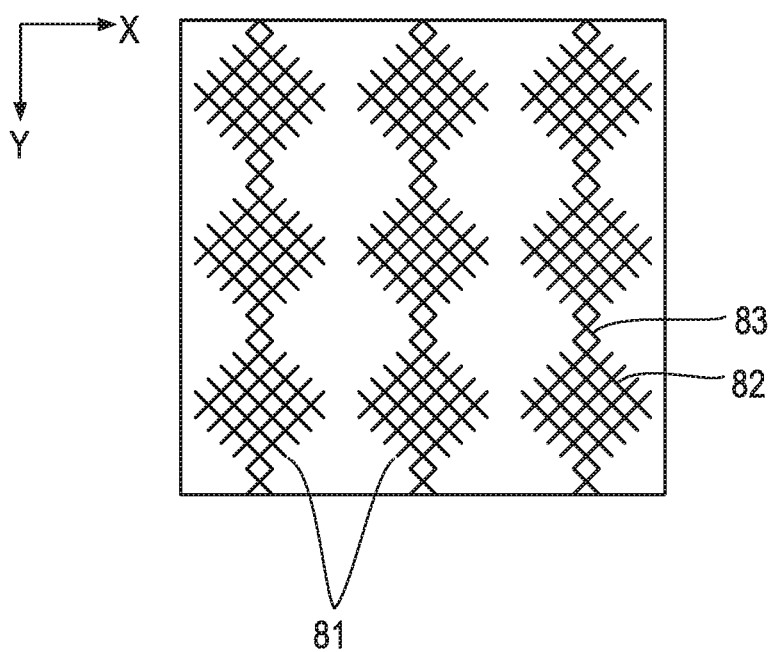
FIG. 17B is a partial enlarged view showing details of rows of second sensor electrodes of the touch panel shown in FIG. 16.

FIG. 17A shows details of each row 71 of first sensor electrodes which is formed at the first conductor layer, and FIG. 17B shows details of each row 81 of second sensor electrodes which is formed at the second conductor layer.

Each row 71 of first sensor electrodes includes island electrodes 72 and joining parts 73, the island electrodes 72 being arrayed in an X direction parallel to a long side 61 of the sensor region 60 and the joining parts 73 joining adjacent ones of the island electrodes 72. The rows 71 of first sensor electrodes are arranged in parallel in a Y direction parallel to a short side 62 of the sensor region 60. Each row 81 of second sensor electrodes includes island electrodes 82 and joining parts 83, the island electrodes 82 being arrayed in the Y direction and the joining parts 83 joining adjacent ones of the island electrodes 82. The rows 81 of second sensor electrodes are arranged in parallel in the X direction. The rows 71 of first sensor electrodes and the rows 81 of second sensor electrodes intersect each other while being insulated from each other, and the joining parts 73 and the joining parts 83 are located so as to overlap with each other. As shown in FIGS. 17A and 17B, the rows 71 of first sensor electrodes and the rows 81 of second sensor electrodes are each formed of a thin-wire mesh which is composed of line segments not parallel to the long sides 61 of the sensor region 60 and not parallel to the short sides 62 thereof (that is, line segments, imaginary straight extensions of which obliquely cross the long sides 61 and obliquely cross the short sides 62) and includes a large number of cellular openings. The outer shapes of the island electrodes 72 and 82 are diamond shapes.

Lead wiring lines 91, lead wiring lines 92, and terminal parts 93 shown in FIG. 16 are each formed at the first conductor layer. Ground wiring lines 94 are formed at each of the first and second conductor layers. Two ends in the X direction of each row 71 of first sensor electrodes are connected to two lead wiring lines 91, and one end in the Y direction of each row 81 of second sensor electrodes is connected to one lead wiring line 92. In FIG. 16, only ones located at two ends of each array of lead wiring lines 91, 92 are shown, and lead wiring lines other than those located at the two ends are not shown.

The terminal parts 93 are formed to be arrayed at a central part of one long side of the transparent substrate 50 having a rectangular shape. Each lead wiring lines 91, 92 extends toward the corresponding terminal part 93 to connect with the corresponding terminal part 93. The ground wiring lines 94 are formed at a peripheral portion of the transparent substrate 50 so as to surround the sensor region 60 and the lead wiring lines 91, 92. The ground wiring lines 94 are also connected to the terminal parts 93.

Although not shown in detail, the thick terminal parts 93 and the thick ground wiring lines 94 are each formed of a thin-wire mesh which is composed of line segments not parallel to the long sides 61 of the sensor region 60 and not parallel to the short sides 62 thereof (that is, line segments, imaginary straight extensions of which obliquely cross the long sides 61 and obliquely cross the short sides 62) and includes a large number of cellular openings in an extension direction and in a width direction, like the rows 71 of first sensor electrodes and the rows 81 of second sensor electrodes. The lead wiring lines 91, 92 are linear wiring lines.

The first and second conductor layers with the above-described configurations are formed by printing with conductive ink including conductive particles of silver or the like, by using the gravure offset printing apparatus shown in FIG. 12. In this example, in gravure offset printing of the first and second conductor layers, occurrence of a printing failure due to conductive ink left on the blanket is prevented, and occurrence of a printing failure due to the doctor blade sunk or caught in a recess in a gravure plate is prevented.

A configuration which avoids sinking or the like of the doctor blade in a recess in a gravure plate will be described.

A traveling direction (that is, a squeegeeing direction) of the doctor blade with respect to a gravure plate defining a pattern for a conductor layer is typically the X direction that is parallel to the long sides 61 of the sensor region 60 or the Y direction that is parallel to the short sides 62 of the sensor region 60. In this example, the squeegeeing direction is set to the X direction. In FIG. 16, an arrow S indicates the squeegeeing direction.

Since the rows 71 of first sensor electrodes and the rows 81 of second sensor electrodes, the terminal parts 93, and the ground wiring lines 94 are each formed of a mesh which is composed of line segments not parallel to the X direction and not parallel to the Y direction, the doctor blade does not sink in recesses in the gravure plate defining patterns for the rows 71 of first sensor electrodes, the rows 81 of second sensor electrodes, the terminal parts 93, and the ground wiring lines 94. In contrast, since the lead wiring lines 91, 92 are each composed of a line segment extending straight and parallel to the X direction or the Y direction, the doctor blade may sink in recesses in the gravure plate defining a pattern for the lead wiring lines 91, 92.

As shown in FIG. 16, each of the lead wiring lines 91 includes a first parallel part 91a, a second parallel part 91b, a third parallel part 91c, and a fourth parallel part 91d between a connection to the corresponding row 71 of first sensor electrodes and a connection to the corresponding terminal part 93. Each of the lead wiring lines 92 includes a first parallel part 92a, a second parallel part 92b, and a third parallel part 92c between a connection to the corresponding row 81 of second sensor electrodes and a connection to the corresponding terminal part 93. In this example, to prevent the doctor blade from sinking in recesses in a gravure plate, the second parallel part 91b of the lead wiring line 91 is formed so as to have a shape corresponding to at least one of:

1) a shape with no linear part parallel to a straight-line segment connecting two ends of the part;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being not more than half of length of the straight-line segment; and
4) a shape in which line segments are connected in series, each line segment having a shape having a part parallel to the straight-line segment and a part not parallel to the straight-line segment.

The present embodiment will be described from another perspective. At least a part of a recess in a gravure plate connects two different points on the gravure plate which are connectable by another recess having a shape of a straight-line segment and has a shape corresponding to at least one of:

1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being not more than half of length of the straight-line segment; and
4) a shape in which line segments are connected in series, each line segment having a shape having a part parallel to the straight-line segment and a part not parallel to the straight-line segment.

Figure 20A:
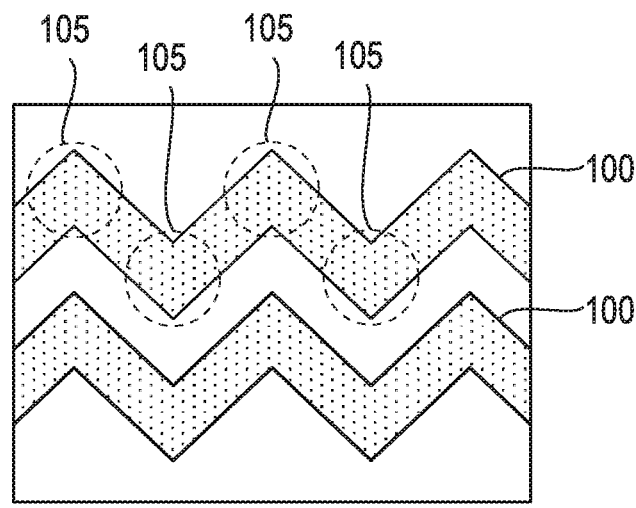
FIG. 20A is a view showing the shape of printed wiring lines.
Figure 20B:
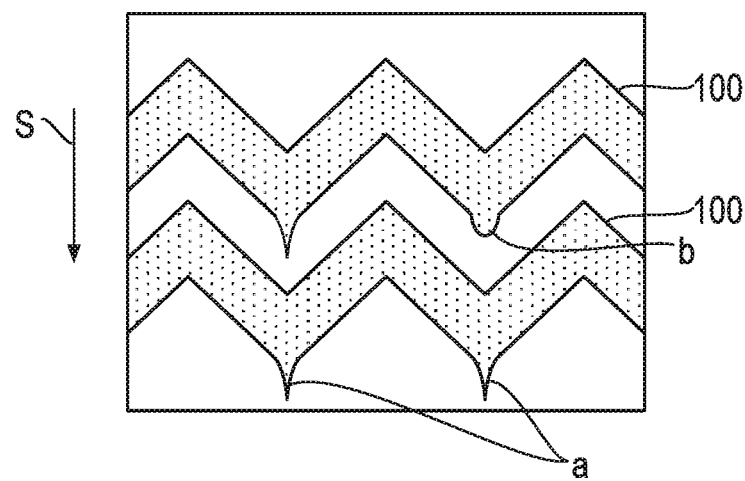
FIG. 20B is a view for explaining conductive ink dragging and bleeding.
Figure 20C:
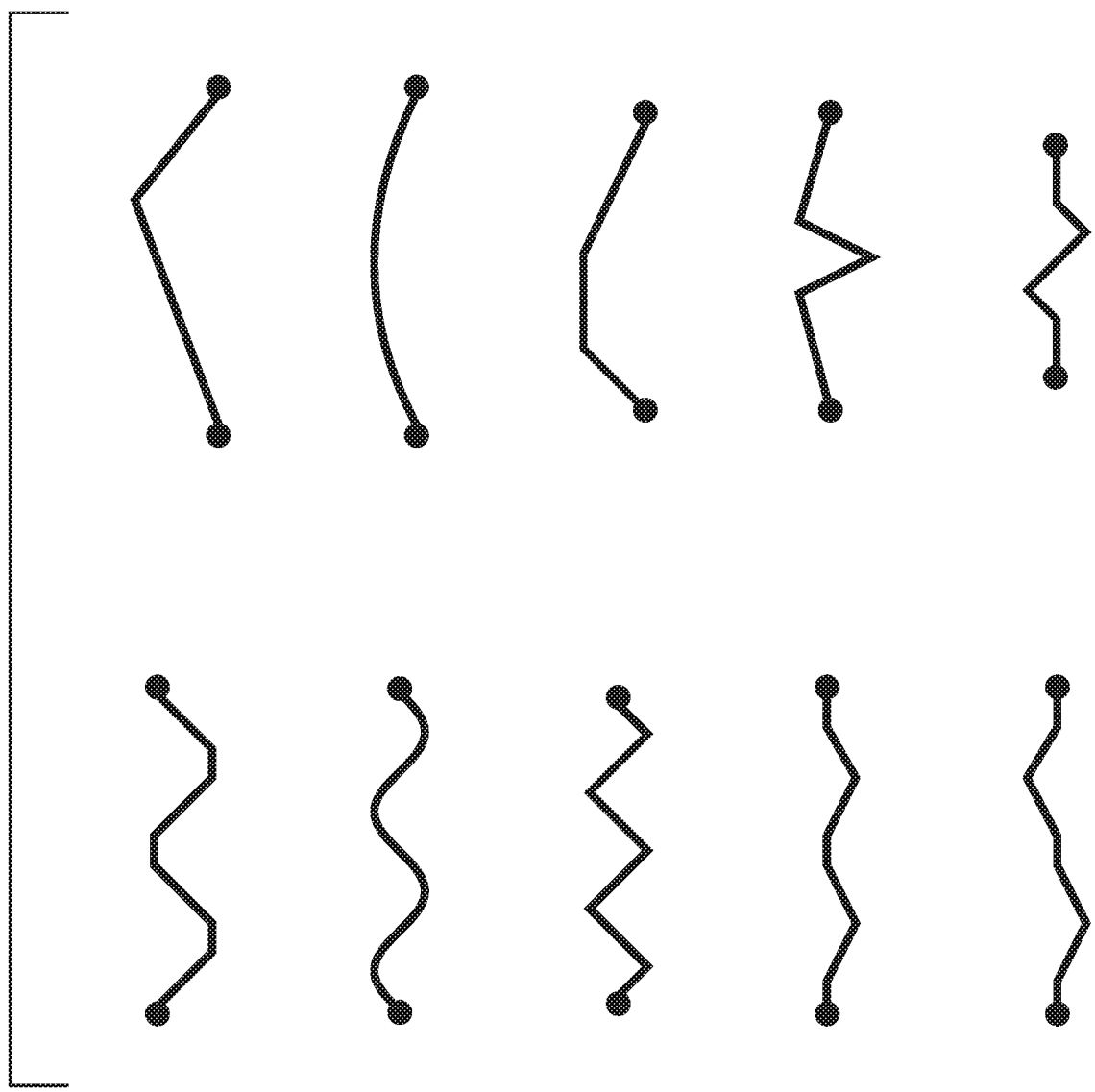
FIG. 20C is a view showing examples of the shape of a recess in a gravure plate.

Some examples of such a recess in a gravure plate are shown in FIG. 20C. Each of 10 examples shown in FIG. 20C has a shape corresponding to at least one of 1) to 4)

described above. The "two different points on the gravure plate that are connectable by the recess with the shape of the straight-line segment" are not limited to two ends of a recess which is recognized to be a single piece by appearance. For example, the two points may be two different bend points of a recess which is recognized to be a single piece by appearance.

The present embodiment will be described from still another perspective. At least two recesses formed parallel to each other in a gravure plate each have a same shape. One of the at least two recesses connects two different points on the gravure plate which are connectable by another recess with a shape of a straight-line segment and has a shape corresponding to at least one of:

1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, length of the part parallel to the straight-line segment being less than length of the part not parallel to the straight-line segment; and
4) a shape in which line segments are connected in series, each line segment having a shape having a part parallel to the straight-line segment and a part not parallel to the straight-line segment.

The at least two recesses are arranged so as to coincide with each other when the at least two recesses are shifted in a direction orthogonal to the straight-line segment.

Figure 18:
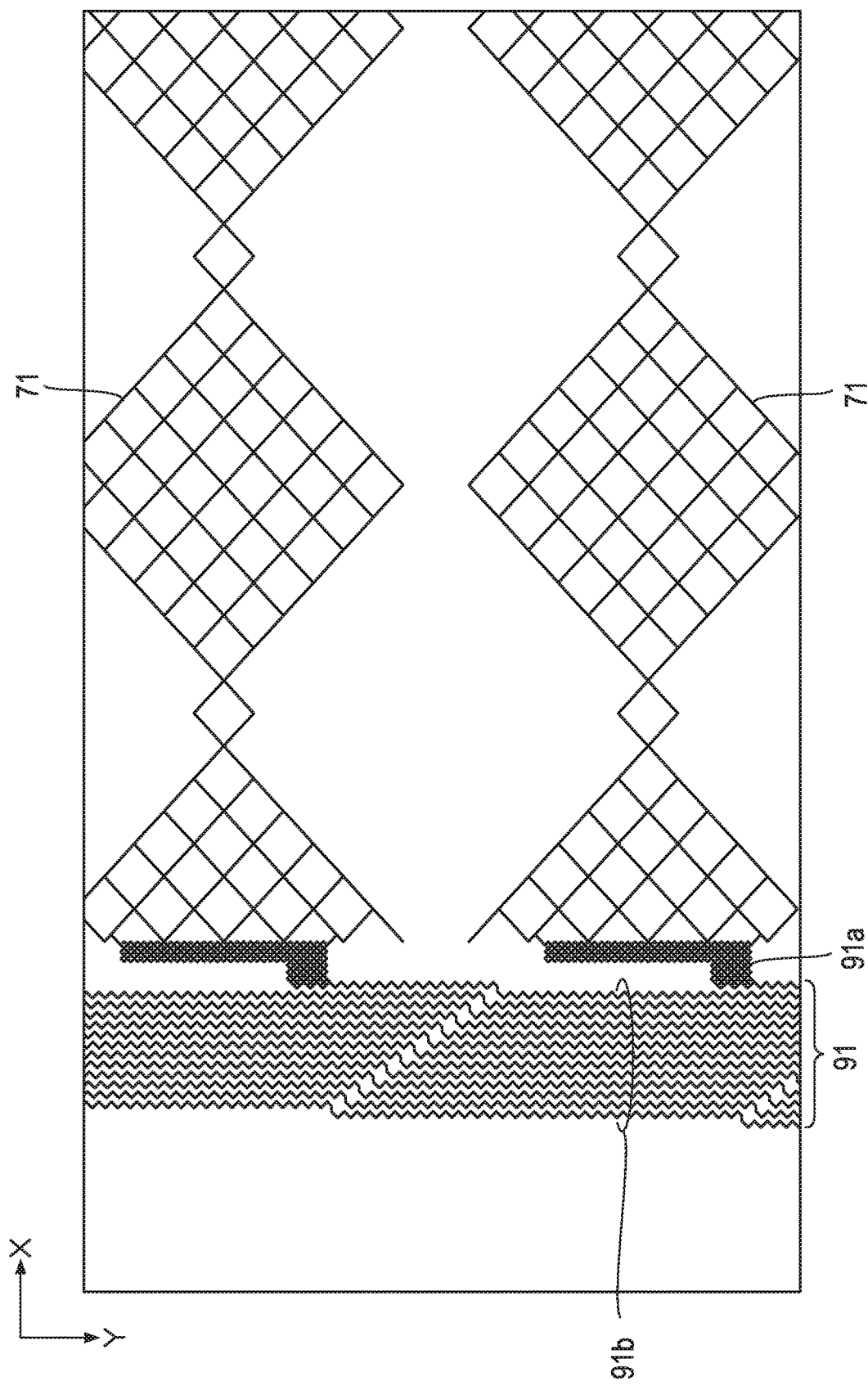
FIG. 18 is a partial enlarged view showing rows of first sensor electrodes in the touch panel shown in FIG. 16 and lead wiring lines led out from the rows of first sensor electrodes.

FIG. 18 shows a state in which the second parallel part 91b of each lead wiring line 91 is formed so as to have a shape corresponding to at least one of 1) to 4) above. FIG. 19 shows a connection between the second parallel part 91b and the third parallel part 91c of each lead wiring line 91. Note that, in this example, each short first parallel part 91a connecting with the corresponding row 71 of first sensor electrodes is formed of a mesh which is composed of line segments not parallel to the X direction and not parallel to the Y direction and is formed to be wide overall, as shown in FIG. 18.

As described above, in the example, the second parallel part 91b of each lead wiring line 91 is formed so as to have a shape corresponding to at least one of 1) to 4) above. The third parallel part 91c of each lead wiring line 91 and the second parallel part 92b of each lead wiring line 92 are each composed of a normal straight line. Note that although not shown in detail, the fourth parallel part 91d of each lead wiring line 91 and the first parallel part 92a and the third parallel part 92c of each lead wiring line 92 are each formed of a mesh and are formed to be wide overall in this example, like the first parallel part 91a of each lead wiring line 91.

As described above, the second parallel part 91b of each lead wiring line 91 is formed so as to have a shape corresponding to at least one of 1) to 4) above. The doctor blade set to be parallel to the Y direction is moved forward in a direction orthogonal to the above-described straight-line segment (that is, the X direction), thereby filling recesses defining a printing pattern for the first conductor layer, the recesses being formed in a gravure plate, with conductive ink. Thus, sinking of the doctor blade in the recesses of the gravure plate can be avoided, and a printing failure due to sinking of the doctor blade can be prevented from occurring.

FIG. 20A shows a shape to be applied to a printed wiring line. The shape of a printed wiring line 100 shown in FIG. 20A is the shape of a wavy line, notably the shape of a triangular wave (the shape corresponds to at least 2) above).

If the second parallel part 91b of each lead wiring line 91, which is formed in a shape as shown in FIG. 20A, the third parallel part 91c of each lead wiring line 91 and the second parallel part 92b of each lead wiring line 92, which are formed in a straight line shape, are each formed to have a same line width as that of a mesh wiring line, a wiring resistance value is too high, and the risk of a break is high. For this reason, these wiring lines are formed to have wiring widths larger than that of a mesh wiring line. Accordingly, as described earlier, conductive ink is likely to be left on the blanket. To prevent occurrence of a printing failure due to conductive ink left on the blanket, projections are formed in each of recesses in a gravure plate which define the second parallel parts 91b of each lead wiring line 91 and in each of recesses in the gravure plate which define the third parallel parts 91c of each lead wiring line 91 and the second parallel parts 92b of each lead wiring line 92.

Figure 21A:
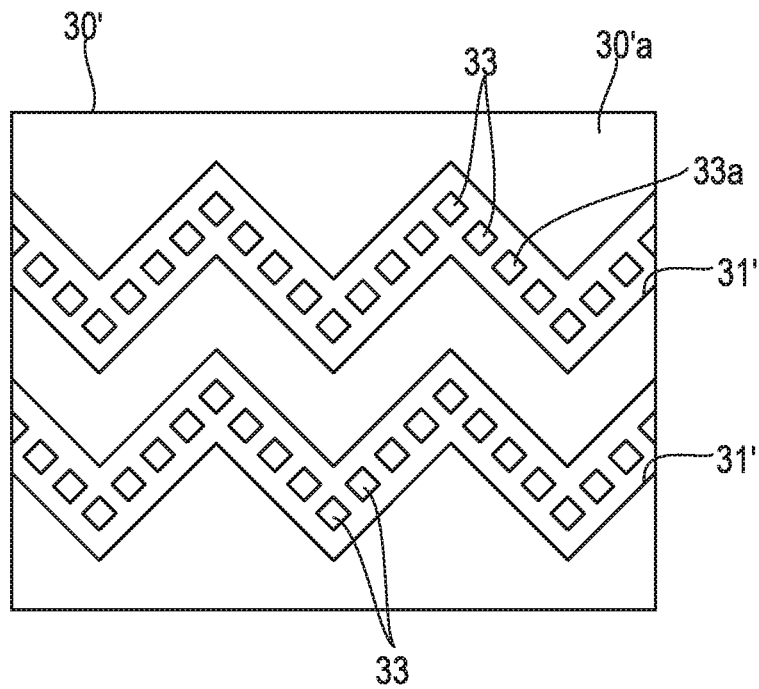
FIG. 21A is a view for explaining a fifth example of the gravure plate according to the second group of aspects.

FIG. 21A shows a state in which projections 33 are formed in recesses 31' each having a triangular wave shape in a gravure plate 30'. The projections 33 are formed in a row along a center line of the recess 31'. Each projection 33 has a square top surface 33a, like the projection 32 shown in FIG. 13A described earlier. The top surfaces 33a are located on a plane including an upper surface 30'a of the gravure plate 30'.

Figure 21B:
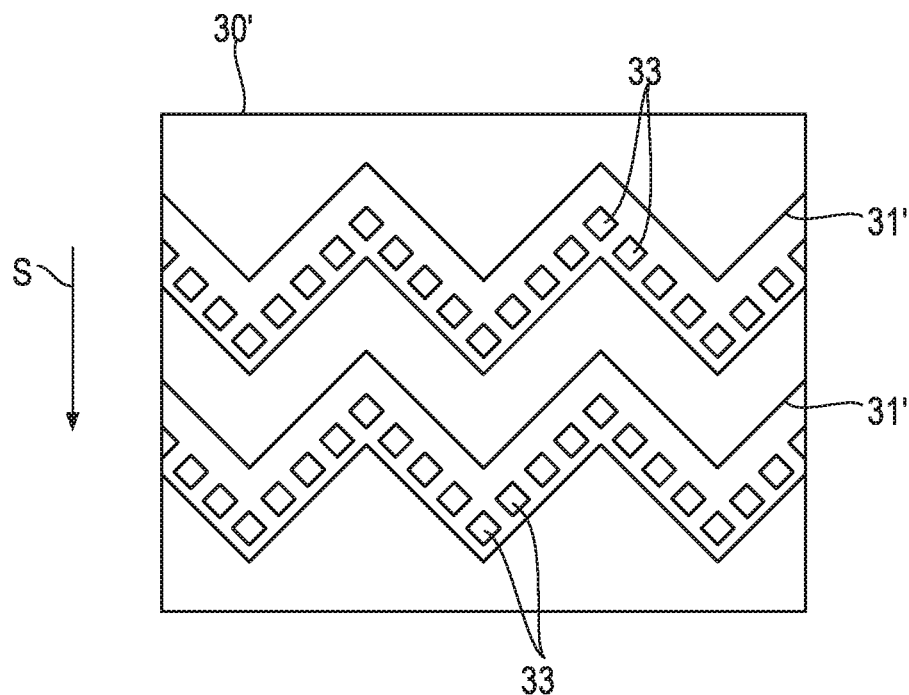
FIG. 21B is a view for explaining a sixth example of the gravure plate according to the second group of aspects.

FIG. 21B shows a state in which the projections 33 are arranged shifted toward the front side in the squeegeeing direction. In the configurations shown in FIGS. 21A and 21B, each projection 33 is arranged so as not to be in contact with any of two side surfaces of the recess 31'.

FIG. 20B shows flaws which may appear in the shapes of the printed wiring lines 100 when the printed wiring lines 100 with a triangular wave shape is printed by gravure offset printing. In FIG. 20B, an arrow S indicates the squeegeeing direction. Ink dragging denoted by reference character "a" may occur at corner parts 105 (that is, a corner of a triangular wave) of the printed wiring lines 100 which are located on the front side in the squeegeeing direction. Ink bleeding denoted by reference character "b" may occur at the corner parts 105 in the triangular wave.

Reduction of the amount of conductive ink charged into the recesses 31' through formation of the projections 33 in the recesses 31' in the gravure plate 30' has the effect of preventing dragging or bleeding as shown in FIG. 20B. In this respect, the projections 33 are preferably formed so as to be located at the corner parts 105 of the wavy line, and are more preferably formed shifted toward the front side of the squeegeeing direction, as shown in FIG. 21B.

Note that the projections 32 are formed in each of recesses in a gravure plate which define the third parallel parts 91c and the second parallel parts 92b of the lead wiring lines 91, 92 that are formed in a straight line shape, like the recesses 31 in the gravure plate 30 shown in FIG. 13A described earlier.

The embodiment of the second group of aspects has been described above. The height of each projection formed on a bottom surface of a recess in a gravure plate which defines a printed wiring line may be less than that of an upper surface of the gravure plate. The planar shape of a top surface of each projection is not limited to a square shape and may be any shape.

The foregoing description of the embodiment of the second group of aspects has been presented for the purpose of illustration and description. It is not intended to be exhaustive or to limit the second group of aspects to the precise form disclosed. Modifications or variations are possible in light of the above teachings. The embodiment was chosen and described to provide the illustration of the principles of the second group of aspects and its practical application, and to enable one of ordinary skill in the art to utilize the second group of aspects in various embodiments and with various modifications as are suited to the particular use contemplated. All such modifications and variations are within the scope of the second group of aspects as determined by the appended claims when interpreted in accordance with the breadth to which they are fairly, legally, and equitably entitled.

What is claimed is:

1. A gravure plate for gravure offset printing, comprising:
a surface to come into contact with a blanket used in the gravure offset printing;
a recess on the surface to retain ink used in the gravure offset printing, the recess having a bottom surface and two side surfaces to define a volume of space inside the recess and the recess defining a pattern of a wiring line to be printed by the gravure offset printing; and
projections on the bottom surface of the recess, the projections having a total volume of space that the projections occupy and the projections protruding inside the recess to reduce the volume of the recess by the total volume of the projections.

2. The gravure plate according to claim 1, wherein
each of the projections has a top not protruding beyond the surface of the gravure plate.

3. The gravure plate according to claim 1, wherein
the projections stand in a row in a longitudinal direction of the recess, and
a number of the projections present in a width direction of the recess between the two side surfaces is one.

4. The gravure plate according to claim 2, wherein
the projections stand in a row in a longitudinal direction of the recess, and
a number of the projections present in a width direction of the recess between the two side surfaces is one.

5. The gravure plate according to claim 1, wherein
at least part of the recess connects two different points on the surface of the gravure plate which are connectable by another recess with a shape of a straight-line segment, the at least part of the recess having a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, a length of the part parallel to the straight-line segment being not more than half of a length of the straight-line segment; and
4) a shape in which line segments are connected in series, each line segment having a shape having a part parallel to the straight-line segment and a part not parallel to the straight-line segment.

6. The gravure plate according to claim 2, wherein
at least part of the recess connects two different points on the surface of the gravure plate which are connectable by another recess with a shape of a straight-line segment, the at least part of the recess having a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, a length of the part parallel to the straight-line segment being not more than half of a length of the straight-line segment; and
4) a shape in which line segments are connected in series, each line segment having a shape having a part parallel to the straight-line segment and a part not parallel to the straight-line segment.

7. The gravure plate according to claim 3, wherein
at least part of the recess connects two different points on the surface of the gravure plate which are connectable by another recess with a shape of a straight-line segment, the at least part of the recess having a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, a length of the part parallel to the straight-line segment being not more than half of a length of the straight-line segment; and
4) a shape in which line segments are connected in series, each line segment having a shape having a part parallel to the straight-line segment and a part not parallel to the straight-line segment.

8. The gravure plate according to claim 4, wherein
at least part of the recess connects two different points on the surface of the gravure plate which are connectable by another recess with a shape of a straight-line segment, the at least part of the recess having a shape corresponding to at least one of:
1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, a length of the part parallel to the straight-line segment being not more than half of a length of the straight-line segment; and
4) a shape in which line segments are connected in series, each line segment having a shape having a part parallel to the straight-line segment and a part not parallel to the straight-line segment.

9. The gravure plate according to claim 5, wherein
the at least part of the recess includes at least a group of corner parts which protrude toward one side of the straight-line segment, and
one or more of the projections stand at each corner part included in the group of corner parts.

10. The gravure plate according to claim 6, wherein
the at least part of the recess includes at least a group of corner parts which protrude toward one side of the straight-line segment, and
one or more of the projections stand arc formed at each corner part included in the group of corner parts.

11. An electronic device comprising:
a substrate having a surface; and a patterned line of conductive ink cured on the surface of the substrate, wherein the patterned line is a gravure-offset printed line, the patterned line includes recesses each of which is surrounded by the conductive ink, the recesses line up in a row in a longitudinal direction of the patterned line and a number of the recesses present in a width direction of the patterned line is one, and the recesses are originated from projections that a gravure plate used in gravure offset printing for the gravure-offset printed line has, the gravure plate having a recess to retain the conductive ink used in the gravure offset printing and the projections being on at least part of a bottom surface of the recess.

12. The electronic device according to claim 11, wherein at least part of the patterned line connects two different points on the surface of the substrate which are connectable by another patterned line with a shape of a straight-line segment, the at least part of the patterned line having a shape corresponding to at least one of:

1) a shape with no linear part parallel to the straight-line segment;
2) a shape in which line segments are connected in series, each line segment having a shape with no linear part parallel to the straight-line segment;
3) a shape having a part parallel to the straight-line segment and a part not parallel to the straight-line segment, a length of the part parallel to the straight-line segment being not more than half of a length of the straight-line segment; and
4) a shape in which line segments are connected in series, each line segment having a shape having a part parallel to the straight-line segment and a part not parallel to the straight-line segment, and wherein the at least part of the patterned line includes the recesses or the at least part of the patterned line has the contour line.

13. A method for producing a wiring line by gravure offset printing that uses a gravure plate and a blanket, the method comprising:

transferring conductive ink for the wiring line onto the blanket using the gravure plate, wherein the gravure plate has:

a surface to come into contact with the blanket a recess on the surface to retain the conductive ink used in the gravure offset printing, the recess having a bottom surface and the recess defining the wiring line; and projections on at least part of the bottom surface of the recess.

14. A method for producing an electronic device which includes a substrate and a wiring line of conductive ink cured on the substrate gravure offset printing, the method comprising:

printing the wiring line on the substrate by gravure offset printing that uses a gravure plate and a blanket, the printing of the wiring line including transferring the conductive ink for the wiring line onto the blanket using the gravure plate, wherein the gravure plate has:

a surface to come into contact with the blanket a recess on the surface to retain the conductive ink used in the gravure offset printing, the recess having a bottom surface and the recess defining the wiring line; and projections on at least part of the bottom surface of the recess.

15. An electronic device comprising:

a substrate having a surface; and a patterned line of conductive ink cured on the surface of the substrate, wherein the patterned line is a gravure-offset printed line, the patterned line has a contour asymmetric with respect to the longitudinal direction of the patterned line, and the asymmetric contour of the patterned line is originated from projections that a gravure plate used in gravure offset printing for the gravure-offset printed line has, the gravure plate having a recess to retain the conductive ink used in the gravure offset printing and the projections being on at least part of a bottom surface of the recess.

* * * * *

UNITED STATES PATENT AND TRADEMARK OFFICE
CERTIFICATE OF CORRECTION

PATENT NO. : 11,310,909 B2
APPLICATION NO. : 16/932025
DATED : April 19, 2022
INVENTOR(S) : Yutaro Kogawa et al.

It is certified that error appears in the above-identified patent and that said Letters Patent is hereby corrected as shown below:

In the Claims

At Column 28, Line 63, in Claim 10, "the projections stand arc formed at each" should be changed to -- the projections stand at each --.

At Column 30, Line 2, in Claim 13, "contact with the blanket" should be changed to -- contact with the blanket; --.

At Column 30, Line 11, in Claim 14, "on the substrate gravure offset printing, the method" should be changed to -- on the substrate, the method --.

At Column 30, Line 19, in Claim 14, "contact with the blanket" should be changed to -- contact with the blanket; --.

Signed and Sealed this
Eighth Day of August, 2023

Katherine Kelly Vidal
*Director of the United States Patent and Trademark Office*